United States Patent [19]
Eto et al.

[11] Patent Number: 6,150,866
[45] Date of Patent: *Nov. 21, 2000

[54] CLOCK SUPPLYING CIRCUIT AND INTEGRATED CIRCUIT DEVICE USING IT

[75] Inventors: Satoshi Eto; Toshikazu Nakamura, both of Kawasaki, Japan

[73] Assignee: Fujitsu Limited, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/977,690

[22] Filed: Nov. 24, 1997

[30] Foreign Application Priority Data

Apr. 1, 1997 [JP] Japan ................................ 9-083050
Apr. 10, 1997 [JP] Japan ................................ 9-091238

[51] Int. Cl.[7] ............................................. H03K 3/00
[52] U.S. Cl. ..................... 327/297; 327/144; 375/356; 713/503
[58] Field of Search ................................. 327/291–297, 327/144, 141, 152, 153; 375/356, 211; 713/503

[56] References Cited

U.S. PATENT DOCUMENTS

| | | | |
|---|---|---|---|
| 5,696,951 | 12/1997 | Miller | 713/503 |
| 5,712,882 | 1/1998 | Miller | 375/356 |
| 5,734,685 | 3/1998 | Bedell et al. | 375/356 |

*Primary Examiner*—Timothy P. Callahan
*Assistant Examiner*—Minh Nguyen
*Attorney, Agent, or Firm*—Arent Fox Kintner Plotkin & Kahn PLLC

[57] ABSTRACT

A clock supplying circuit that supplies a clock to a plurality of controlled circuits 451–454 arranged in respectively different positions. A forward and backward wiring 41, 42 and an internal clock supply wiring 43 are arranged along controlled circuits. A main clock drive circuit 40 is for outputting a first clock to the forward wiring 41 and is for outputting a second shorter phase than the first clock to the internal clock supply wiring 43. A plurality of local clock drive circuits 441–444 arranged close to the controlled circuits, are supplied with a forward clock propagated along the forward wiring and with a back clock propagated along the backward wiring, and are also supplied with the second clock, for delaying the phase of the supplied second clock so as to coincide with a phase intermediate the forward clock and the back clock, and for supplying the delayed clock of the second clock to the respectively corresponding controlled circuits as local clock.

16 Claims, 23 Drawing Sheets

60 Shift Register

DUMMY DELAY CIRCUIT 866

CLOCK SUPPLYING CIRCUIT AND INTEGRATED CIRCUIT DEVICE USING IT

BACKGROUND OF THE INVENTION

1. Field of the Invention

The present invention relates to a clock supplying circuit, and in particular relates to an internal clock supplying circuit in an integrated circuit device such as a synchronous DRAM that operates synchronised with an external clock.

2. Description of the Related Art

Demands for increased speed of operation in recent years have led to the development of integrated circuit devices whose internal circuitry is operated in synchronism with a clock supplied from the system. Examples of such integrated circuit devices are synchronous DRAMs and RAM-bus DRAMs. In such integrated circuit devices, usually, an internal clock is generated on the basis of an external clock supplied from outside and synchronised internally with this external clock. High speed operation is feasible by controlling the internal circuits using this internal clock. In this case, since the propagation of the clock signal in the integrated circuit is subject to a certain delay, the internal circuit operation is aligned with the system timing by generating an internal clock that coincides with the phase of the external clock, taking into account this delay time.

FIG. 13 is a layout diagram of a synchronous DRAM. This memory 10 comprises: an address buffer 12 that latches address signals from outside, a decoder 14 that decodes the address signals, a driver 16 that drives a word line in accordance with the decoder output, a memory cell region 18, sense amplifier 20, bit selection circuit 22 and a plurality of output buffers 24–27.

In this example, output buffers 24–27 are supplied with internal clock $I_{CLK}$ and output data with the timing of this clock. A DLL (Delayed Lock Loop) circuit 30 is provided within the memory to align this output timing with the timing of the external clock $E_{CLK}$ supplied from the system. This DLL circuit 30 inputs the external clock $E_{CLK}$ and generates an internal clock $I_{CLK}$ taking into account the propagation delay time resulting from the resistance R1 and capacitance C of wiring 32 through which the internal clock signal is propagated. As a result, an internal clock $I_{CLK}$ whose phase coincides with that of external clock $E_{CLK}$ is supplied to output buffers 24–27.

However, as shown in FIG. 13, even if internal clock $I_{CLK}$ is supplied to the plurality of output buffers 24–27 so as to operate them with the same timing, due to the presence of resistances R2, R3, R4 of wiring 32 corresponding to the positions where these output buffers are disposed, the internal clocks $I_{CLK1}$–$I_{CLK4}$ that are supplied to the respective output buffers 24–27 have different phases. In particular, if a large number of output buffers are arranged in a row, wiring 32 that supplies the internal clock becomes long, resulting in a considerable phase offset of the internal clock $I_{CLK}$ supplied at the output buffer that is nearest DLL circuit 30 and the output buffer that is furthest. Such "skewing" of the internal clock makes it impossible for all the output buffers to output data synchronously with external clock $E_{CLK}$.

Likewise, there are provided for example a number of address buffer circuits 12 corresponding to the number of address signals. Thus, even if it is intended that the address signals are acquired and latched uniformly with the external clock timing, the internal clock phases supplied to the respective address buffer circuits are still offset. The same problem of skewing of the internal clock occurs likewise in effecting synchronisation at an arbitrary position in an integrated circuit such as for example a logic circuit or microprocessor in addition to memory.

Methods of eliminating this skewing of the internal clock include adopting a tree structure for the wiring from the clock driver and matching the timings at respective positions where the internal clock is supplied, or making the wirings whereby the clock is supplied all of the same length. However, all of these necessitate excess wiring and so constitute a factor lowering spatial efficiency.

SUMMARY OF THE INVENTION

Accordingly, an object of the present invention is to solve the aforementioned problems and to provide a clock supplying circuit wherein skewing of the internal clock at an arbitrary position in the integrated circuit can be eliminated.

A further object of the present invention is to provide a clock supplying circuit and an integrated circuit device employing this wherein skewing of the internal clock dependent on the position in which an internal circuit is arranged can be eliminated, when an internal circuit arranged at an arbitrary position in the integrated circuit is operated in synchronism with an internal clock.

Another object of the present invention is to provide a clock supplying circuit that is capable of supplying an internal clock to a plurality-of internal circuits with the same timing without dependence on the arrangement of this plurality of internal circuits.

In order to achieve the above objects, according to the present invention, there is provided a clock supplying circuit that supplies a clock to a plurality of controlled circuits arranged in respectively different positions, comprising:

a forward and backward wiring arranged along the plurality of controlled circuits;

an internal clock supply wiring arranged along the plurality of controlled circuits;

a main clock drive circuit for outputting a first clock to the forward wiring of the forward and backward wiring and for outputting a second clock whose period is shorter than the first clock to the internal clock supply wiring; and a plurality of local clock drive circuits arranged, in the respective vicinities of the controlled circuits, being supplied with a forward clock propagated by the first clock along the forward wiring and with a back clock propagated along the backward wiring of the forward and backward wiring, and being also supplied with the second clock propagating along the internal clock supply wiring, for delaying the phase of the supplied second clock so as to coincide with a phase intermediate the forward clock and the back clock, and for supplying the delayed clock of the second clock to the respectively corresponding controlled circuits as local clock.

According to the above construction, the local clocks are generated having a phase intermediate that of the forward clock and the back clock for phase comparison, so, irrespective of the positions of the local clock drive circuits, the phases of the plurality of local clocks can be made to coincide. A clock having the aligned phase can therefore be supplied to a plurality of controlled circuits arranged in different positions in an integrated circuit device.

Further according to the present invention there are provided first and second forward and backward wirings, a first and second group of controlled circuits, and first and second local clock drive circuits that supply local clocks to the controlled circuits each of which are arranged along the respective forward and backward wirings, while the main clock drive circuit outputs a first clock to the forward wirings of the first and second forward and backward wirings. Further according to the present invention there is provided a forward and backward wiring delay circuit on the second forward and backward wiring. The delay time of this forward and backward wiring delay circuit is controlled such that the phases of the two back clocks that are propagated along the first and second backward wirings coincide.

According to the above construction, even when a first and second controlled circuit group are arranged on both sides of the main clock drive circuit, first and second forward and backward wirings being arranged respectively along these, the propagation times of the first and second forward and backward wirings can be made the same. As a result, the first and second local clock drive circuits arranged in the first and second controlled circuit groups can generate local clocks that have the same timing. The flexibility of arrangement of the main clock drive circuit and the local clock drive circuits can consequently be increased.

DESCRIPTION OF THE PREFERRED EMBODIMENTS

Embodiments of the present invention are described below with reference to the drawings. However, the technical scope of the present invention is not restricted by these embodiments.

Figure 1:
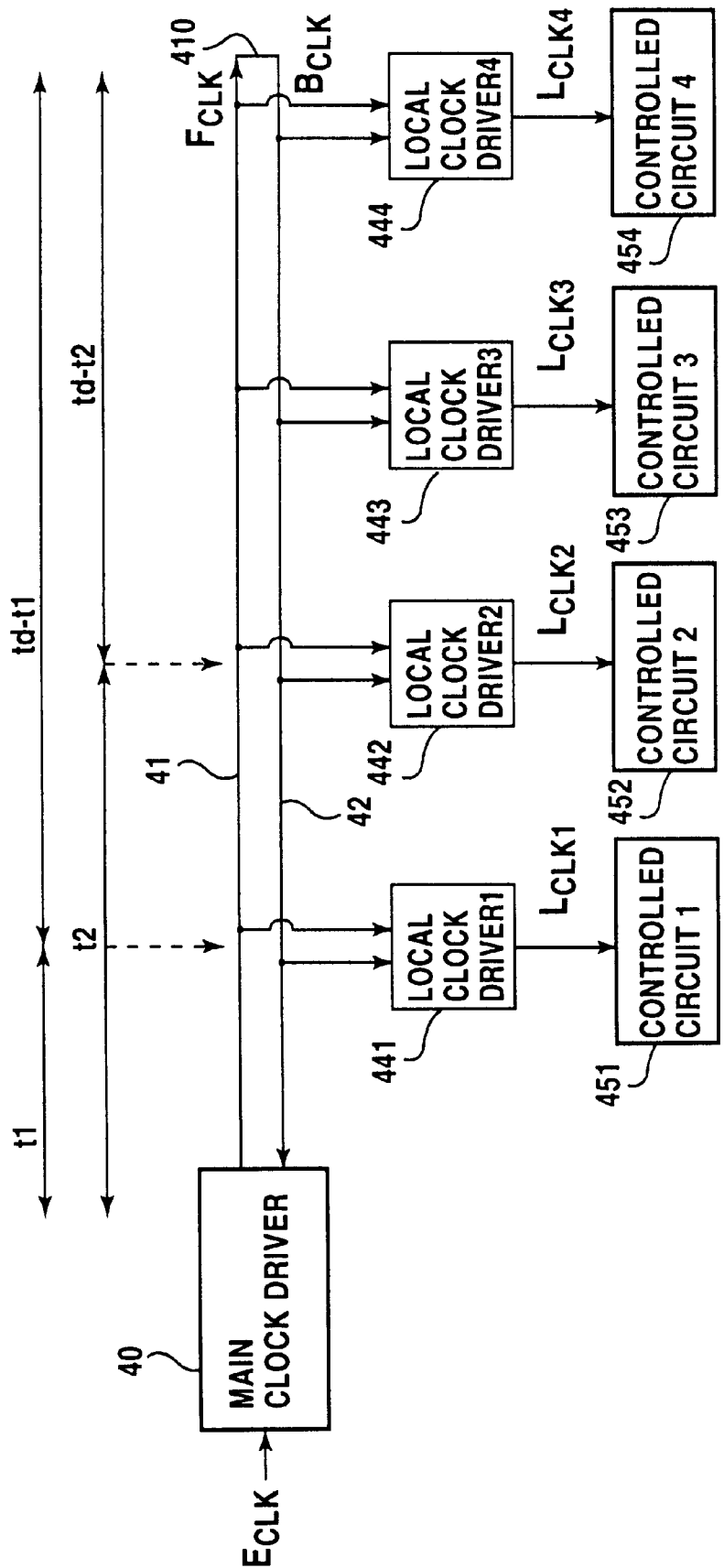
FIG. 1 is a diagram of a clock supplying circuit according to an embodiment of the present invention.

FIG. 1 is a view of a clock supplying circuit according to an embodiment of the present invention. The present embodiment comprises a main clock drive circuit 40 and local clock drive circuits 441–444 provided in the vicinity of controlled circuits 451–454 within the integrated circuit. Forward wiring 41 and backward wiring 42 are arranged along local clock drive circuits 441–444. A clock from main clock drive circuit 40 is supplied on forward wiring 41 and this clock is returned at the extremity of forward wiring 41 and propagated through backward wiring 42. Accordingly, the clock on forward wiring 41 will be called forward clock $F_{CLK}$ and the clock on backward wiring 42 will be called back clock $B_{CLK}$.

The forward clock $F_{CLK}$ and back clock $B_{CLK}$ are supplied to each of local clock drive circuits 441–444 from forward and backward wiring 41 and 42 at the positions in the vicinity of the respective circuits, and local clocks $L_{CLK1}$–$L_{CLK4}$ with timing intermediate that of forward clock $F_{CLK}$ and back clock $B_{CLK}$ are generated by respective local clock drive circuits. That is, the phases of the local clocks in all cases match the phase of forward clock $F_{CLK}$ at the extremity 410 of forward wiring 41.

Figure 2:
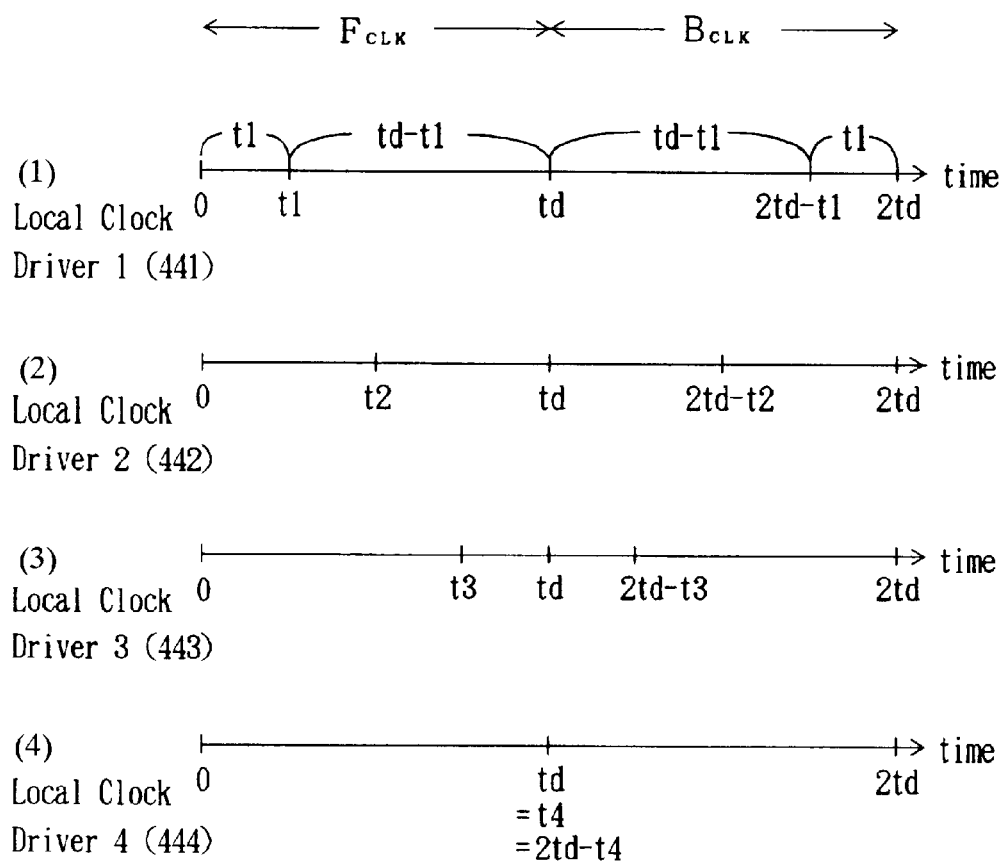
FIG. 2 is a diagram given in explanation of the timing of a local clock in FIG. 1.

FIG. 2 is a view given in explanation of the timing of the local clocks of FIG. 1. In FIG. 2, the timing of forward clock $F_{CLK}$ and back clock $B_{CLK}$ and the timing of local clock $L_{CLK}$ at local clock drive circuits 441–444 are respectively shown.

As shown in FIG. 1 also, forward clock $F_{CLK}$ generated by main clock drive circuit 40 is input to local clock drive circuit 441 at the timing of time point t1. Also, back clock $B_{CLK}$ is input at the timing of time point 2td–t1. td is the time required for the clock to propagate along forward wiring 41. In FIG. 2, the period from time point 0 to time point 2td indicates the time taken by the clock to be propagated through forward wiring 41 and backward wiring 42.

Local clock drive circuit 441 generates a local clock of timing:

$$\{t1+(2td-t1)\}/2=td$$

which is a timing intermediate the forward clock $F_{CLK}$ that is input at time point t1 and the back clock $B_{CLK}$ that is input at time point 2td–t1.

Likewise, as shown in FIG. 2, local clock drive circuit 442 generates a local clock of timing:

$$\{t2+(2td-t2)\}/2=td$$

which is a timing intermediate that of forward clock $F_{CLK}$, which is input at time point t2 and back clock $B_{CLK}$, which is input at time point 2td–t2. Furthermore, as shown in FIG. 2, the timings of the local clocks generated in local clock drive circuits 443 and 444 are respectively:

$$\{t3+(2td-t3)\}/2=td$$

$$\{t4+(2td-t4)\}/2=td$$

The timings of all the local clocks $I_{CLK1}$–$I_{CLK4}$ are therefore a time point td irrespective of their position. In this example, forward wiring 41 and backward wiring 42 are merely arranged along the local clock drive circuits from the main clock drive circuit 40: this layout does not lower wiring efficiency. Thus, by giving the local clock drive circuits the function of generating clocks of timing intermediate that of forward clock $F_{CLK}$ and back clock $B_{CLK}$, local clocks of identical timing (time point td) can be generated whatever the position in which the local clock drive circuit is arranged. The degrees of freedom available in design are thereby enormously increased.

Figure 13:
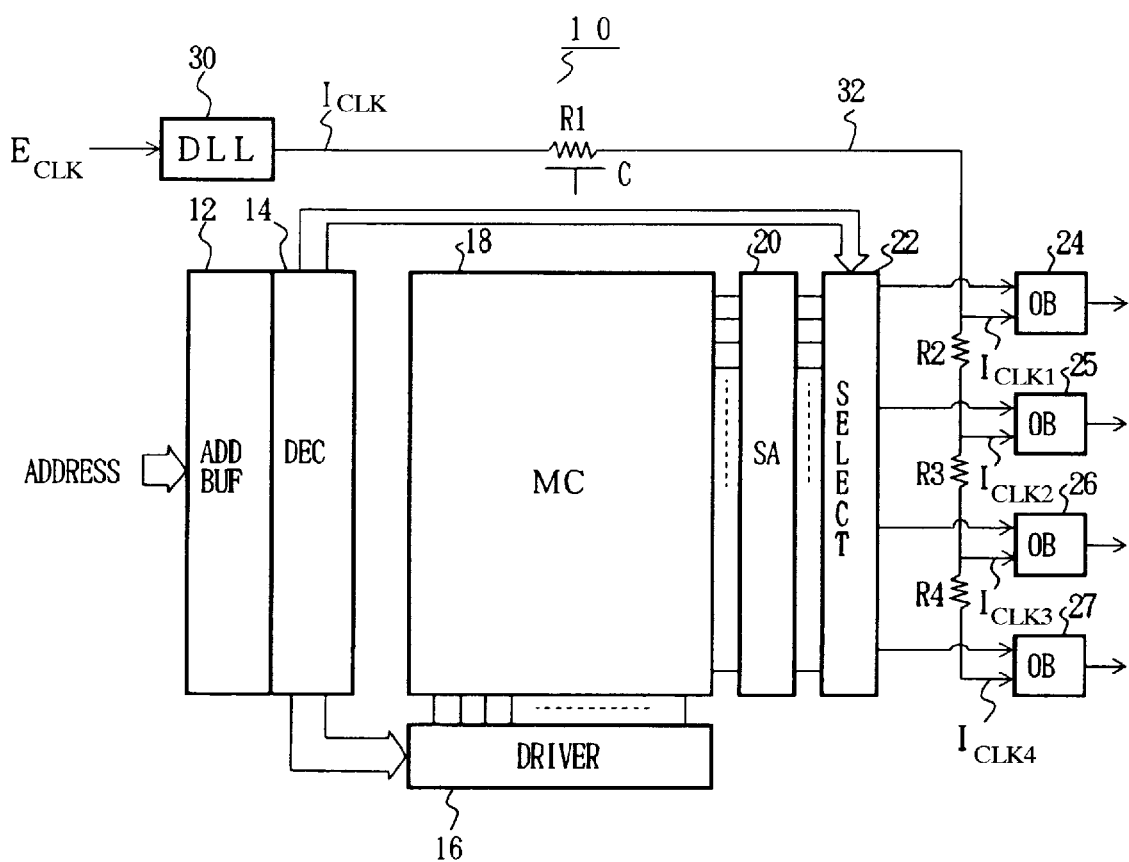
FIG. 13 is a diagrammatic circuit layout of a synchronous DRAM.

In the example of FIG. 1, respective local clocks $L_{CLK1}$–$L_{CLK4}$ are supplied to controlled circuits 451–454 so that these controlled circuits are operated with identical timing. Applied to the example of the output buffers shown in FIG. 13, main clock drive circuit 40 corresponds to DLL circuit 30 which is supplied with external clock $E_{CLK}$, and the controlled circuits respectively correspond to the output buffers. Also, main clock drive circuit 40 corresponding to DLL circuit 30 generates a clock such that the timings of operation of each controlled circuit coincide with the timing (time point td) at which forward clock $F_{CLK}$ reaches the extremity 410 of forward wiring 41.

Second Embodiment

Figure 3:
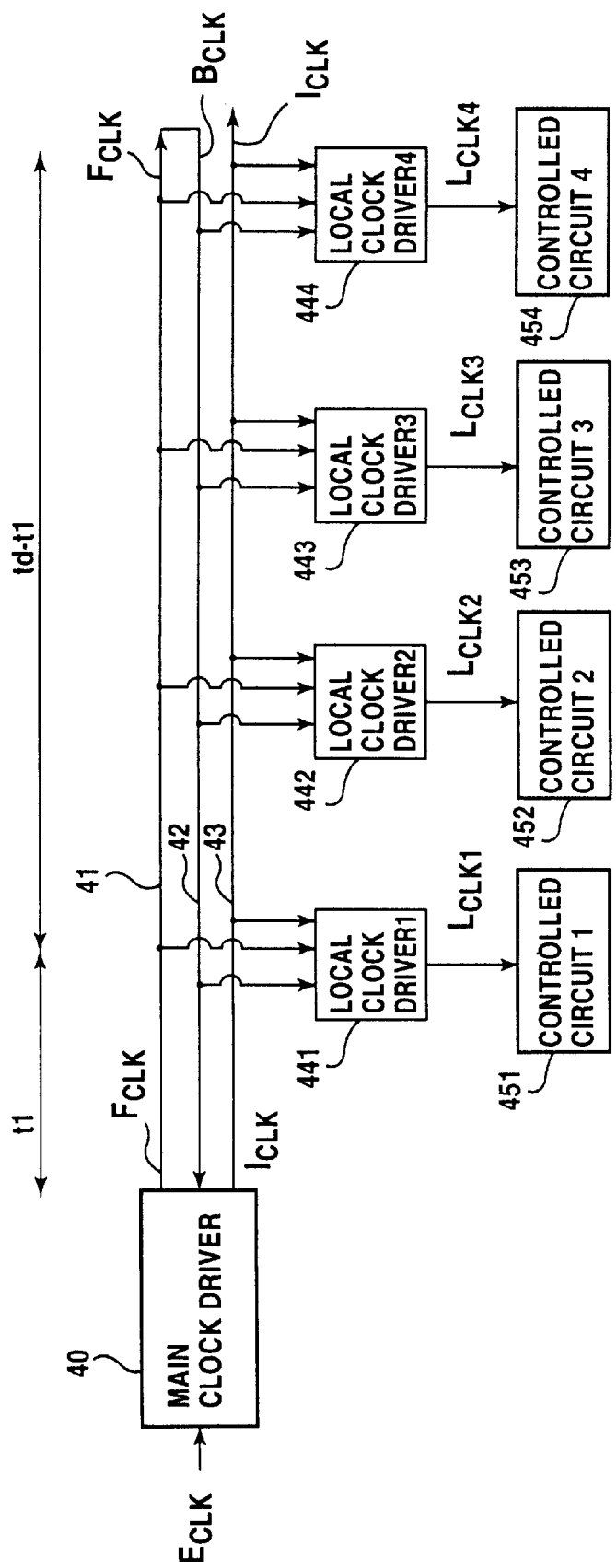
FIG. 3 is a diagram of a clock supplying circuit according to a second embodiment of the present invention.

FIG. 3 is a diagram of a clock supplying circuit according to a second embodiment of the present invention. In this example, in addition to forward clock $F_{CLK}$ and backward clock $B_{CLK}$ of FIG. 1, an internal clock $I_{CLK}$ is generated by main clock drive circuit 40. For this purpose, internal clock wiring 43 is added. In this example, whereas internal clock $I_{CLK}$ has the same period as external clock $E_{CLK}$, forward clock $F_{CLK}$ and back clock $B_{CLK}$ have a longer period than internal clock $I_{CLK}$. Preferably, the period of the forward clock and back clock are set to more than 2td, which is the time for propagation along forward wiring 41 and backward wiring 42. Alternatively, the period of the H level or L level of the forward clock or back clock is set to more than the time 2td for propagation along forward wiring 41 and backward wiring 42. By this means, generation of a local clock $L_{CLK}$ by local clock drive circuits 441–444 is facilitated.

Figure 4A:
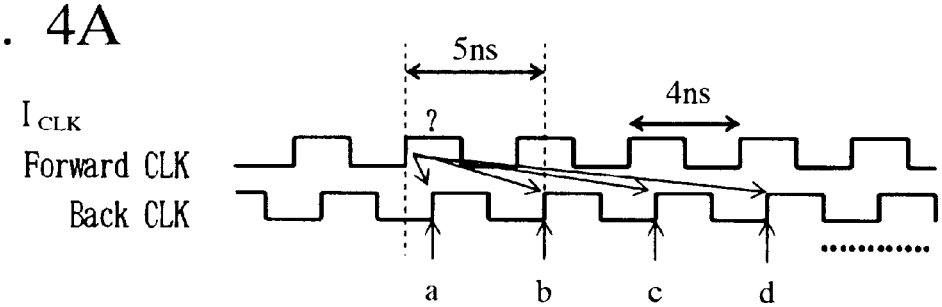
FIG. 4A and 4B are diagrams given in explanation of the periods of forward clock $F_{CLK}$ and back clock $B_{CLK}$.

FIG. 4 is a diagram given in explanation of the periods of forward clock $F_{CLK}$ and back clock $B_{CLK}$. FIG. 4A shows a timing chart of the case where the forward clock and back clock have practically the same period as internal clock $I_{CLK}$. Internal clock $I_{CLK}$ has the same short period as the external clock for ordinary high-speed operation. For example, in the case of FIG. 4A, this period is 4 nsec. In this case, assuming that the delay time produced by wirings 41 and 42 exceeds this period of 4 nsec, it is difficult for a local clock drive circuit that is supplied with both clocks $F_{CLK}$ and $B_{CLK}$ to identify whether back clock $B_{CLK}$ has a delay of "a" shown in FIG. 4A with respect to forward clock $F_{CLK}$, or has a delay of "b", or has a delay of "c" or "d".

Figure 4B:
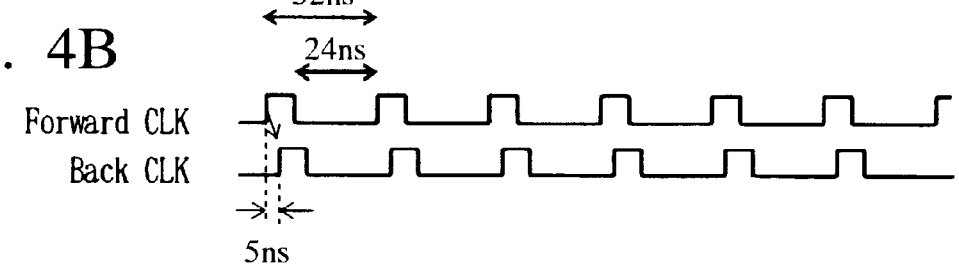

Accordingly, in the clock supplying circuit of FIG. 3, the period of forward clock $F_{CLK}$ and back clock $B_{CLK}$ are set to be longer than internal clock $I_{CLK}$. Internal clock $I_{CLK}$ has the same short period as external clock $E_{CLK}$, to make possible high-speed operation. In FIG. 4B, the period of forward clock $F_{CLK}$ and back clock $B_{CLK}$ is set to the long period of 32 nsec. Consequently, as shown at "b" of FIG. 4A, even if back clock $B_{CLK}$ is 5 nsec delayed from forward clock $F_{CLK}$, since this delay is within 32 nsec, the local drive circuit can easily detect the difference of these two delay times. This forward clock and back clock could be generated by frequency division of external clock $E_{CLK}$, or could be generated by an oscillating circuit independently of the external clock.

Figure 11:
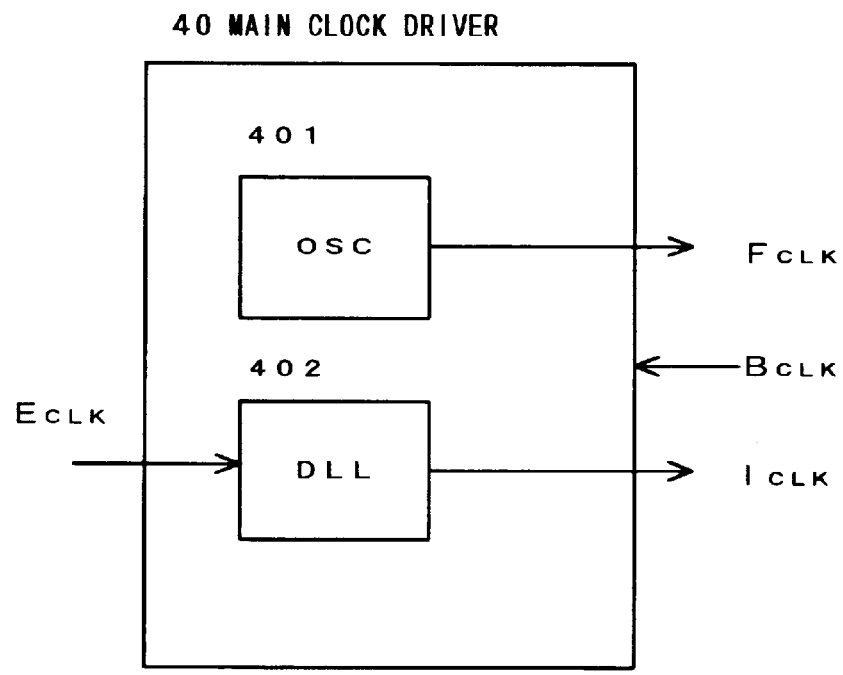
FIG. 11 is a diagram of a circuit layout of a main clock drive circuit.

FIG. 11 is a diagram showing an example layout of a main clock drive circuit 40. In this example, there are provided a DLL circuit 402 that generates an internal clock $I_{CLK}$ of the phase described above from external clock $E_{CLK}$ and an oscillating circuit 401 that generates a forward clock $F_{CLK}$ independent of external clock $E_{CLK}$.

Figure 12:
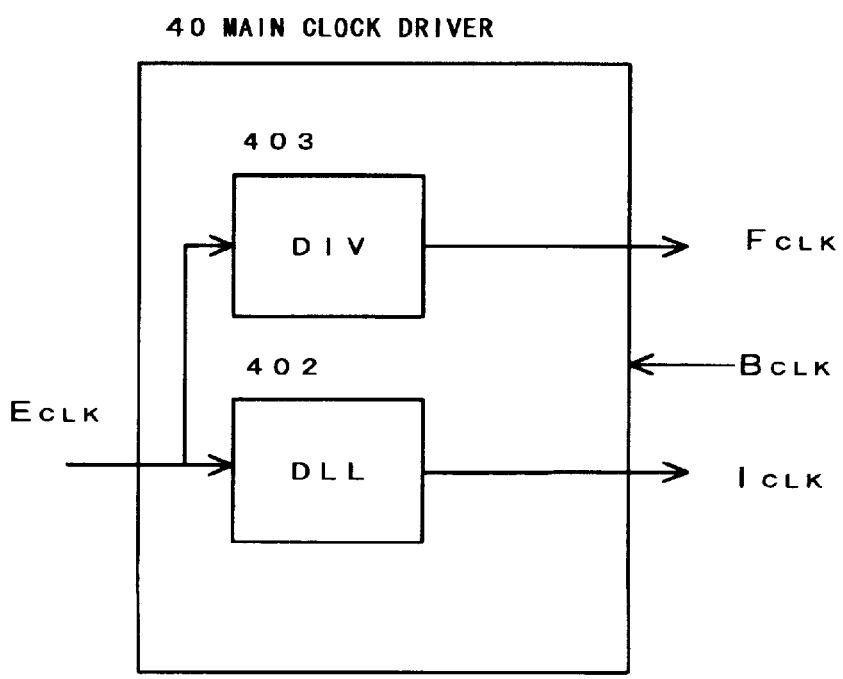
FIG. 12 is a diagram showing a further example layout of a main clock drive circuit.

FIG. 12 is a diagram showing a further example layout of main clock drive circuit 40. In this example, there are provided a DLL circuit 402 that generates an internal clock $I_{CLK}$ of the phase described above from external clock $E_{CLK}$ and a frequency division circuit 403 that generates a forward clock $F_{CLK}$ by frequency division of external clock $E_{CLK}$.

Returning to FIG. 4, it is possible to make the difference in phase of the forward and back clocks $F_{CLK}$ and $B_{CLK}$ always shorter than one clock period by making the period of the forward clock and back clock longer than the delay time 2td of clock wirings 41 and 42. Consequently, the difference in delay time of the two clocks can be detected more clearly.

Furthermore, as will be described, in a local clock drive circuit, the length of the H level of the forward clock and back clock are set to be longer than the delay time 2td of clock wirings 41 and 42. As a result, the delay times of the two clocks can be sampled with a timing where the H levels of the two clocks overlap. The same effect can therefore be anticipated as in the case where the length of the L levels of the two clocks is set to be longer than 2td.

Figure 5:
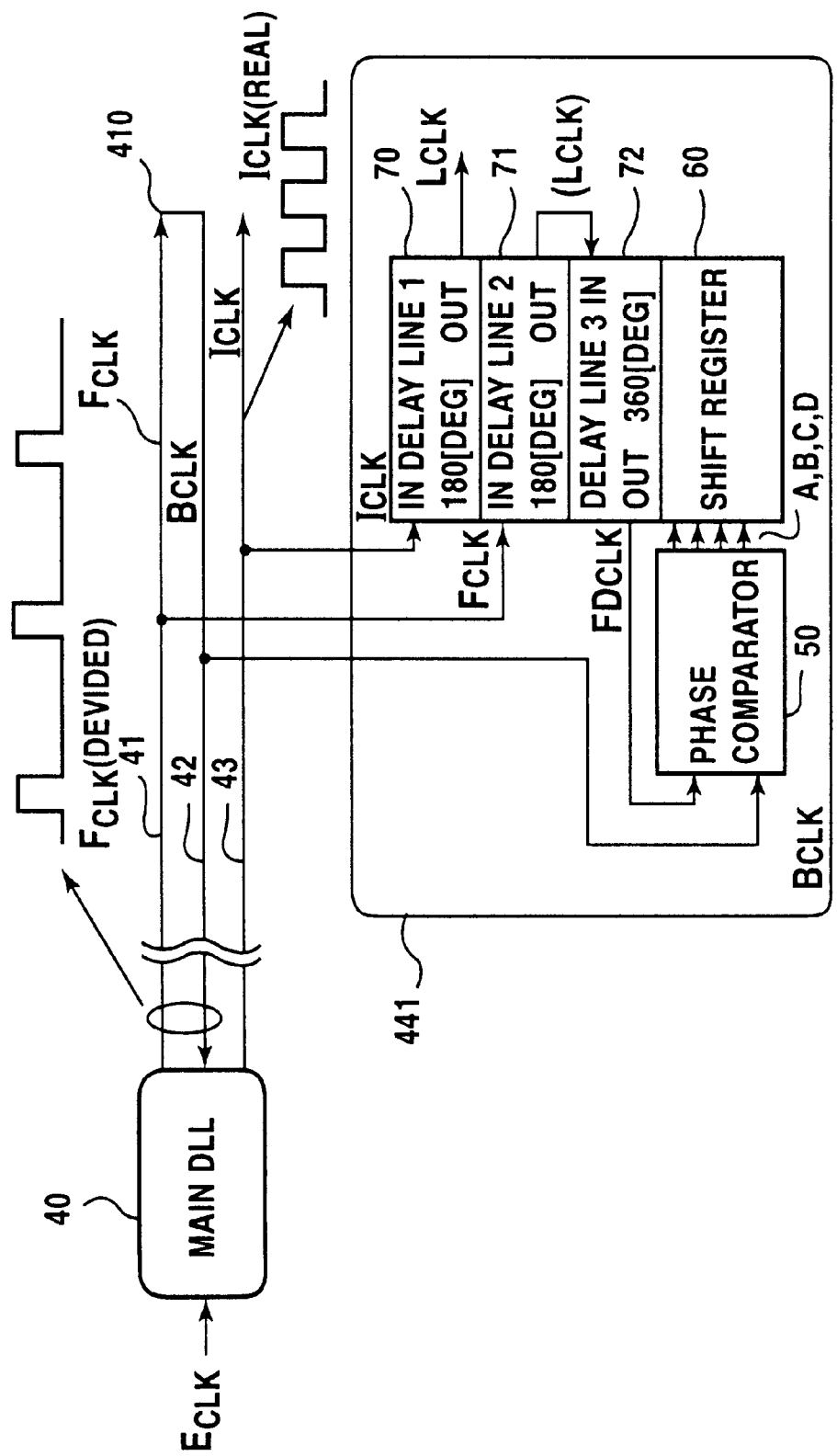
FIG. 5 is a diagram showing an example layout of a local clock drive circuit.

FIG. 5 is a diagram showing an example layout of a local clock drive circuit according to the second embodiment. In the example of FIG. 5, main clock drive circuit 40 is supplied with external clock $E_{CLK}$ and generates internal clock $I_{CLK}$ and the forward clock $F_{CLK}$ such that the timing at which the clock arrives at the extremity 410 of the wiring and the external clock $E_{CLK}$ are synchronised.

Local clock drive circuit 441 comprises a phase comparison circuit 50, shift register 60 as a delay controller and delay circuits 70, 71, and 72. First delay circuit 70 is supplied with internal clock $I_{CLK}$ and outputs local clock $L_{CLK}$ that has been subjected to a prescribed time delay. Also, second and third delay circuits 71 and 72 are supplied with forward clock $F_{CLK}$ and output a clock $FD_{CLK}$ having a delay time that is twice the delay time of the first delay circuit 70. Phase comparison circuit 50 compares the phase of this clock $FD_{CLK}$ and back clock $B_{CLK}$. This phase comparison result is supplied to shift register 60 and shift register 60 controls the delay time of the three delay circuits 70, 71 and 72.

If local clock drive circuit 441 is assumed to be driver circuit 441 at the left end in FIG. 3, the delay times of the first to the third delay circuits 70, 71, 72 are all controlled to (td−t1). In this way, a local clock $L_{CLK}$ is obtained by delaying the internal clock $I_{CLK}$ by (td−t1). Since internal clock $I_{CLK}$ already has a delay of t1, local clock $L_{CLK}$ has a delay of td from the output stage of main DLL 402. This is the timing with which extremity 410 is reached. Furthermore, clock $FD_{CLK}$ is a clock obtained by delaying forward clock $F_{CLK}$ by 2(dt−t1). As described with reference to FIG. 2, clock $FD_{CLK}$ having this delay is a clock which is synchronised in phase with back clock $B_{CLK}$.

Consequently, phase comparison circuit 50 detects which of back clock $B_{CLK}$ and clock $FD_{CLK}$, which is delayed by 2(td−t1) from forward clock $F_{CLK}$, is leading in phase, or whether their phases are the same. The control value of shift register 60 is controlled by these detection signals A–D, and the delay time of delay circuits 70–72 is controlled in accordance with this control value. Thus, overall, the phase of clock $FD_{CLK}$ and back clock $B_{CLK}$ are controlled to coincide. Outputs A–D of phase comparison circuit 50 are detection signals indicating the phase comparison result which is output in accordance with the phase difference between clock $FD_{CLK}$ and back clock $B_{CLK}$. For example, signals A, B are signals that detect the phase of clock $FD_{CLK}$ is lagging with respect to back clock $B_{CLK}$. The control value of the shift register is controlled in response to these signals A, B to a value such as to make the delay time of the delay circuit shorter; as a result, the phases of clock $FD_{CLK}$ and local clock $L_{CLK}$ are speeded up. Contrariwise, signals C, D are signals that detect the phase of clock $FD_{CLK}$ is leading that of back clock $B_{CLK}$. The control value of the shift register is controlled in response to these signals C, D to a value such as to prolong the delay time of the delay circuit; as a result, the phases of clock $FD_{CLK}$ and local clock $L_{CLK}$ are slowed down. Furthermore, if the phases are coincident, detection signals A–D are all L level. In this way, local clock $L_{CLK}$ always has a phase intermediate that of forward clock $F_{CLK}$ and back clock $B_{CLK}$.

It should be noted that, in the case of the clock supplying circuit shown in FIG. 1, internal clock $I_{CLK}$ and forward clock $F_{CLK}$ are the same clock. Consequently, in this case, in local clock drive circuit 441, first delay circuit 70 can be eliminated from the example of FIG. 5 and the output of second delay circuit 71 used as local clock $L_{CLK}$.

Figure 6:
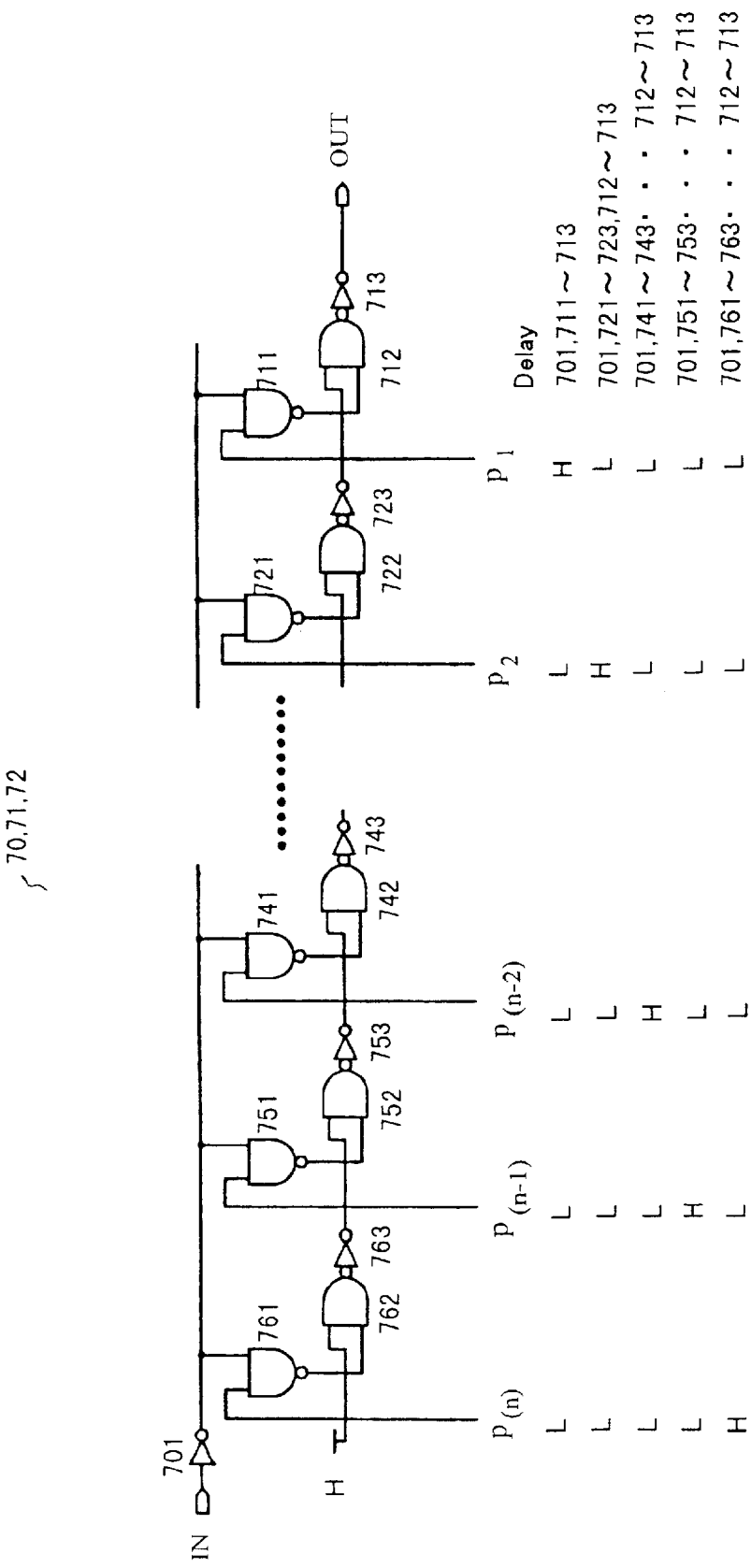
FIG. 6 is a circuit diagram of delay circuits 70, 71, 72 of a local clock drive circuit.

FIG. 6 is a circuit diagram showing an example of delay circuits 70, 71, 72 of a local clock drive circuit. Delay circuits 70, 71, 71 have the same circuit construction. Their delay times are selected by control signals p1–p(n). These delay circuits output the clock that is applied at input terminal IN at output terminal OUT with a prescribed time delay. In this example, there are n delay circuit stages, the first stage being constituted by NANDs 711, 712 and inverter 713, the second stage being constituted by NANDs 721, 722 and inverter 723 and likewise hereinbelow the n-th stage being constituted by NANDs 761, 762 and 763.

One of control signals p1–p(n) is H level, while all the others are L level. The corresponding NAND 711, 721, . . . 761 is then opened by the control signal p that has become H level, so that the applied clock at the input IN is passed. The other NANDs 711, 721, . . . 761 corresponding to control signals p of L level are closed. As shown in the drawing, NAND 711 is opened when control signal p1 is H level, with the result that a delay path is formed from input terminal IN to output terminal OUT through inverter 701, NANDs 711 and 712 and inverter 713. A delay of four gate stages is therefore provided.

When control signal p2 is H level, NAND 721 is opened. Since the input of gate 762 is also H level, the output of inverter 763 is H level and likewise the outputs of inverters 753, 743 . . . are H level. Consequently, NAND 722 is also in opened condition. As a result, a delay path is formed from input terminal IN to output terminal OUT through inverter 701 and gates 721–723, 712, 713. Consequently, a delay of six gate stages is provided.

Hereinbelow, as shown in FIG. 6, every time the H-level control signal p is shifted to the left, the number of gates in the delay path is increased by 2. When control signal p(n) is H level, a delay path is formed comprising 2+2n gate stages.

Figure 7:
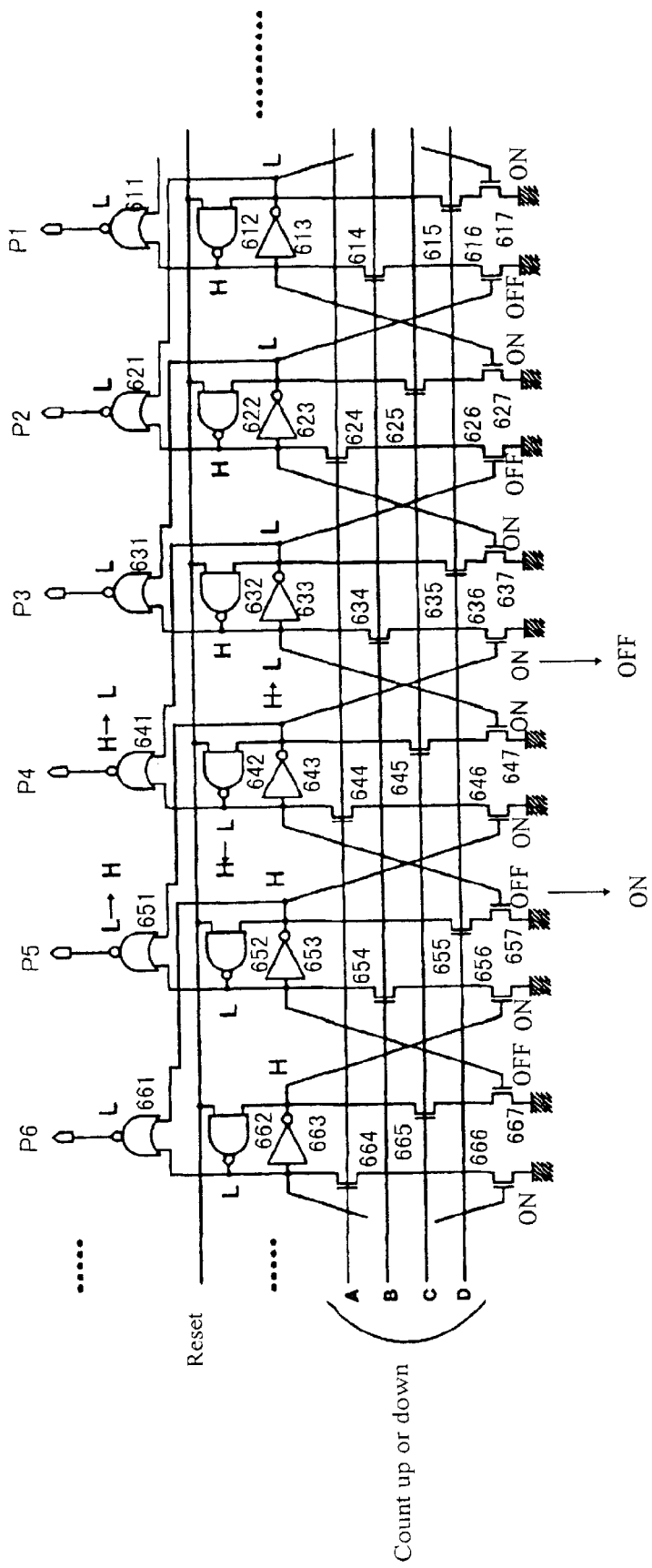
FIG. 7 is a circuit diagram of a shift register 60 of a local clock drive circuit.

FIG. 7 is a circuit diagram of the shift register 60. In this Figure, part of the shift register is shown and, for convenience in description, control signals p1–p6 of the delay circuits are shown. Detection signals A–D from phase comparison circuit 50 are supplied to this shift register 60: the H-level control signal p is shifted to the right by signals A, B and H-level control signal p is shifted to the left by signals C, D.

Each stage of shift register 60 respectively comprises a latch circuit including, for example in the first stage, NAND gate 612 and inverter 613. Also, it comprises transistors 614, 615 that forcibly invert the condition of latch circuits 612, 613 in response to detection signals A–D. Transistors 616, 617 are provided in order to ensure that latch circuits not to be the subject of inversion are not inverted by transistors 614, 615. The layout of the circuits of the second to sixth stages is identical. All these transistors are N-channel transistors.

Let us now provisionally assume that the fourth-stage output p4 is in H level condition. The other output are all in L level condition. The condition of the latch circuits of each stage is indicated in FIG. 7 by H or L. Specifically, in the latch circuits from the first stage to the third stage, the NAND (612, 622, 632) output is H level and the inverter (613, 623, 633) output is L level, while, in the latch circuits of the fourth stage to the sixth stage, the NAND (642, 652, 662) output is L level while the inverter (643, 653, 663) output is H level. Of the transistors that are connected to ground, 617, 627, 637, 647, 646, 656 and 666 respectively are therefore in conductive condition. That is, transistor 647 in the fourth stage circuit and transistor 636 in the third stage circuit, which are on both sides of the boundary in respect of latching condition, are in conductive condition, and their latch condition is a condition that can be inverted in response to detection signal B or C.

Supposing that, at this point, H level is applied by detection signal C, transistor 645 conducts, so that the output of inverter 643 is forcibly driven from H level to L level. As a result, the output of NAND gate 642 is also changed over from L level to H level and this condition is latched. Since the output of NAND gate 642 becomes H level, the output p4 of NOR gate 641 becomes L level and, in turn, due to change in the output of inverter 643 to L level, the output p5 of NOR gate 651 is changed over to H level. As a result, the H-level control signal shifts from p4 to p5. As described with reference to FIG. 6, with shifting of the H-level control signal p leftwards, the delay path of the delay circuit becomes longer and the delay time is controlled to be longer.

In contrast, if we suppose that H level is applied by detection signal B, the output of NAND gate 632 of the third latch circuit is forcibly changed over to L level by an action identical with that described above, and the output of inverter 633 is changed over to H level. As a result, output p3 becomes H level. The delay path of the delay circuit thereby becomes shorter and the delay time is controlled to become shorter.

Furthermore, when output p5 or p3 becomes H level, the H-level output is now controlled to be shifted respectively to the right or to the left in response to detection signal A or D. That is, detection signals A, B control a rightwards shift of H-level output and detection signals C, D control a leftwards shift of H-level output. Furthermore, detection signals A and D effect shift control when outputs p1, p3 or p5 are H level, and detection signals B, C effect shift control when outputs p2, p4, p6 are H level.

Figure 8:
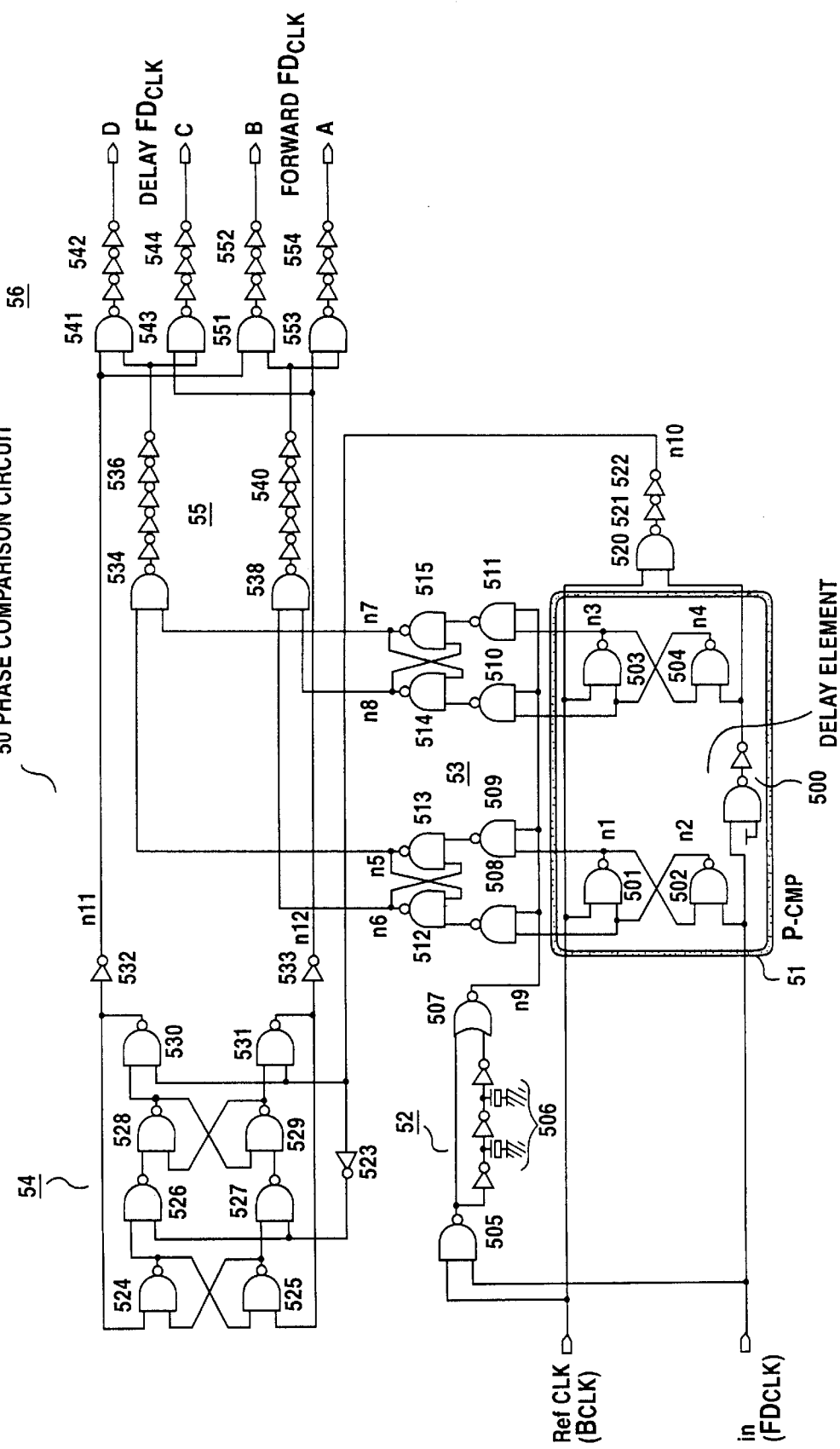
FIG. 8 is a detail circuit diagram of a phase comparison circuit 50 of a local clock drive circuit.

FIG. 8 is a detailed circuit diagram of phase comparison circuit 50. This phase comparison circuit 50 has a phase detection section 51 that detects the relationship of the phases of the two clocks, namely, of input terminal In, which is supplied with the clock $FD_{CLK}$, and reference clock terminal RefCLK, which is supplied with back clock $B_{CLK}$. This phase detection circuit 51 has two latch circuits and detects the conditions: (1) where the phase of clock $FD_{CLK}$ leads that of back clock $B_{CLK}$ by more than a fixed time; (2) where the phase of clock $FD_{CLK}$ is in a phase difference relationship within a fixed time with respect to back clock $B_{CLK}$, and (3) when the phase of clock $FD_{CLK}$ lags back clock $B_{CLK}$ by more than a fixed time. The above three conditions are detected by a combination of detection outputs n1–n4.

Sampling pulse generating section 52 outputs a sampling signal to node n9 when the two clocks $B_{CLK}$ and $FB_{CLK}$ are both H level. Sampling latch circuit section 53 samples detection outputs n1–n4 by means of sampling gates 508–511 under the control of sampling signal n9, and latches these by means of a latch circuit consisting of NANDs 512, 513 and 514, 515. The detection outputs n1–n4 on sampling are therefore respectively latched in nodes n5–n8.

Divide-by-2 frequency divider circuit 54 detects when both clocks $FD_{CLK}$ and $B_{CLK}$ are H level by means of NAND gate 520 and divides this detection pulse n10 in frequency by a factor of 2, to generate inverse-phase pulse signals n11 and n12. Decoder section 55 decodes the signals that have been sampled and latched at nodes n5–n8 and, if clock $FD_{CLK}$ leads reference clock $B_{CLK}$, makes the output of diode 536 H level; if the phases of both clocks coincide, it makes the outputs of diodes 536 and 540 both L level; and if clock $FD_{CLK}$ lags clock $B_{CLK}$, it makes the output of diode 540 H level. In accordance with the output of decoder section 55, output circuit section 56 outputs detection signals A–D in response to inverse-phase pulse signals n11 and n12.

Detection signals A–D control the condition of shift register 60 as already described.

Figure 9:
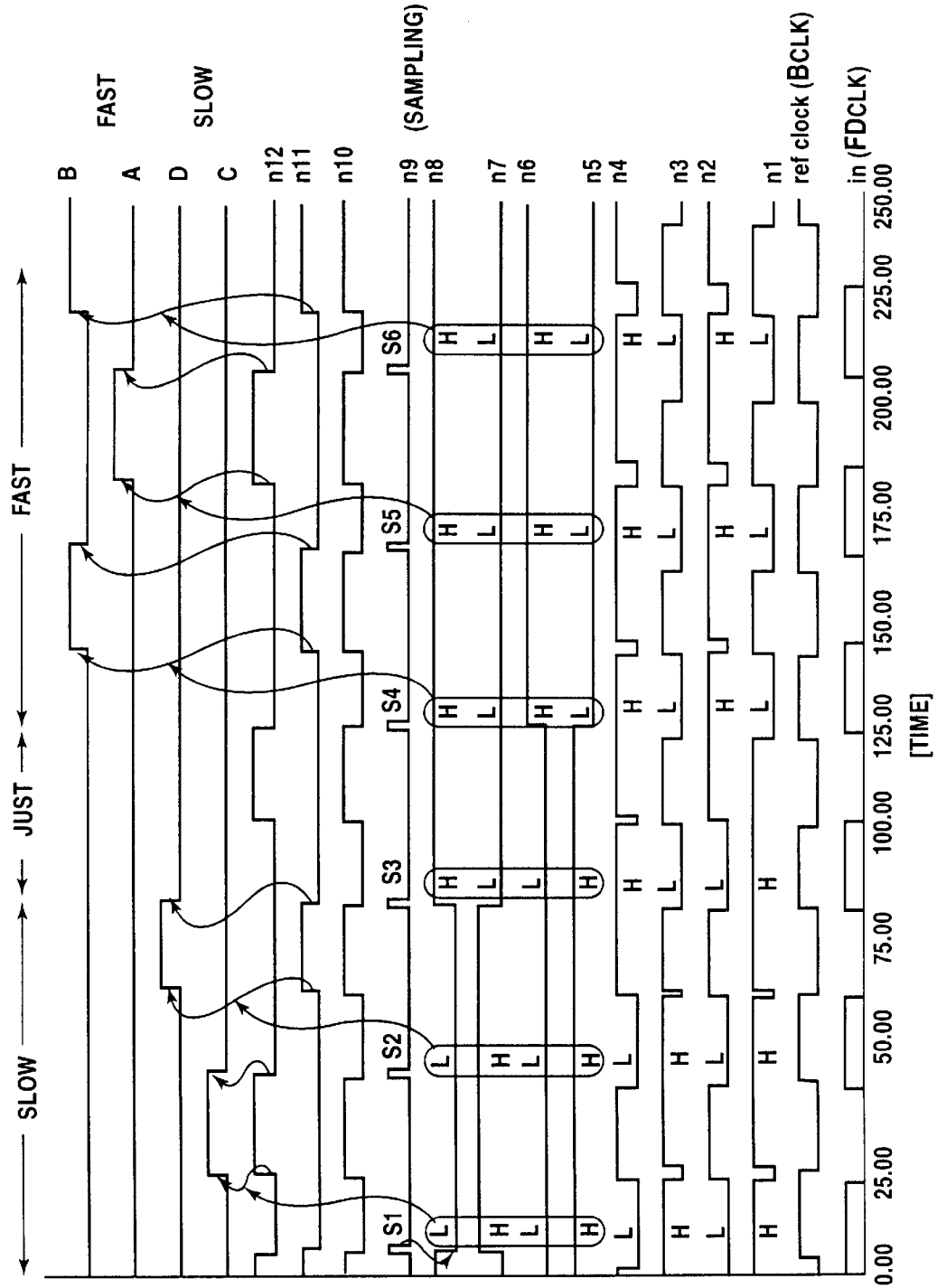
FIG. 9 is a timing chart illustrating the operation of a phase comparison circuit.

FIG. 9 is a timing chart showing the operation of FIG. 8. This FIG. 9 shows, in order, the condition in which clock $FD_{CLK}$ leads back clock $B_{CLK}$, the condition in which the phases of both clocks coincide, and the condition in which clock $FD_{CLK}$ lags back clock $B_{CLK}$. More specifically, when sampling pulse n9 is S1 or S2, clock $FD_{CLK}$ is leading, so this is detected and detection signal C is output with H level in response to pulse n12, while detection signal D is output with H level in response to pulse n11. When the sampling pulse is S3, the phases coincide and detection signals A–D are all L level. Further, in the case of sampling pulses S4, S5, S6, clock $FD_{CLK}$ lags, so this is detected and detection signal B in response to pulse n11 or detection signal A in response to pulse n12 respectively become H level.

The above operation is described in sequence below.
Sampling pulse S1

In this period, the clock $FD_{CLK}$ is leading to the back clock $B_{CLK}$. Therefore, from a condition in which both clocks $FD_{CLK}$ and $B_{CLK}$ are L level, clock $FD_{CLK}$ first becomes H level and node n2 is latched at L level while node n1 is latched at H level. NAND and inverter 500 constitute a delay element that applies a fixed time delay to clock $FD_{CLK}$, and in NAND 503 and 504, node n3=H level and node n4=L level are likewise latched. Accordingly, in sampling generating section 52, a sampling pulse n9 having a width corresponding to the delay time of delay circuit 506 is generated from the timing with which the two clocks $FD_{CLK}$, $B_{CLK}$ both become H level, the latch condition in phase comparison section 51 is sampled, and this latch condition is latched by latch section 53. That is, the condition of nodes n1–n4 is transferred to nodes n5–n8.

Pulse n10 is then generated with the timing at which both clocks $FD_{CLK}$ and $B_{CLK}$ become H level. In frequency divider section 54, the latch circuits of NANDs 524, 525 and the latch circuits of NANDS 528, 529 are coupled by gates 526, 527 and gates 530, 531, these gates being opened by an inverting and non-inverting pulse of pulse n10. Consequently, pulse n10 is divided in frequency by a factor of 2.

In decoder section 55, in response to the H, L, H, L level condition of nodes n5–n8, the output of inverter 538 becomes H level and the output of inverter 540 becomes L level. Consequently, in response to pulse n12, H level of inverter 536, through NAND 543 and inverter 544, makes detection signal C become H level. In response to the H level of detection signal C, the H level output of the shift register is shifted to the left and the delay path of delay circuits 71, 72, 73 becomes longer. As a result, clock $FD_{CLK}$ is controlled in the lagging direction.
Sampling pulse S2

In the same way as described above, it is detected by phase comparison section 51 that clock $FD_{CLK}$ is leading, and so that the detection signal D becomes H level in response to pulse n11. Consequently, in the same way, the H-level output of shift register 60 shifts to the left, increasing the length of the delay path of delay circuits 71, 72, 73.
Sampling pulse S3

At the timing at which sampling pulse S3 is output, the phases of both clocks $FD_{CLK}$ and $B_{CLK}$ are practically coincident. If there is a phase offset within the delay time in delay element 505 and clock $FD_{CLK}$ is slightly leading, we have:

n1=H, n2=L, n3=L, n4=H
n5=H, n6=L, n7=L, n8=H

This condition is shown in FIG. 9. Also, if there is a phase offset within the delay time in delay element 505, and there is a slight lag of clock $FD_{CLK}$, we have:

n1=L, n2=H, n3=H, n4=L
n5=L, n6=H, n7=H, n8=L

In either case, these are decoded by decoder section 55, with the result that the outputs of both inverters 536 and 540 become L level and detection outputs A–D all become L level. As a result, the condition of shift register 60 is unchanged and there is no change in the delay times of delay circuits 71, 72, 73.
Sampling pulses S4, S5 and S6

In this case, clock $FD_{CLK}$ is lagging from the back clock $B_{CLK}$. Consequently, the latch condition of phase comparison section 51 becomes:

n1=L, n2=H, n3=L, n4=H and, as a result, in the sampled latch section 53 also, we have:

n5=L, n6=H, n7=L, n8=H

This condition is decoded by decoder section 55 and results in L level output of inverter 536 and H-level output of inverter 540. The detection signals B and A therefore respectively become H level in response to pulse n11 and n12. As a result, the output p of shift register 60 is shifted rightwards, shortening the delay path of delay circuits 71, 72, 73 and so shortening the delay time. As a result, clock $FD_{CLK}$ is controlled in the advancing direction.

As described above, by means of the closed loop of phase comparison circuit 50, shift register 60, delay circuits 72, 73 and clock $FD_{CLK}$, the phase of local clock $L_{CLK}$ is controlled to a timing intermediate that of forward clock $F_{CLK}$ and back clock $B_{CLK}$.

Figure 10:
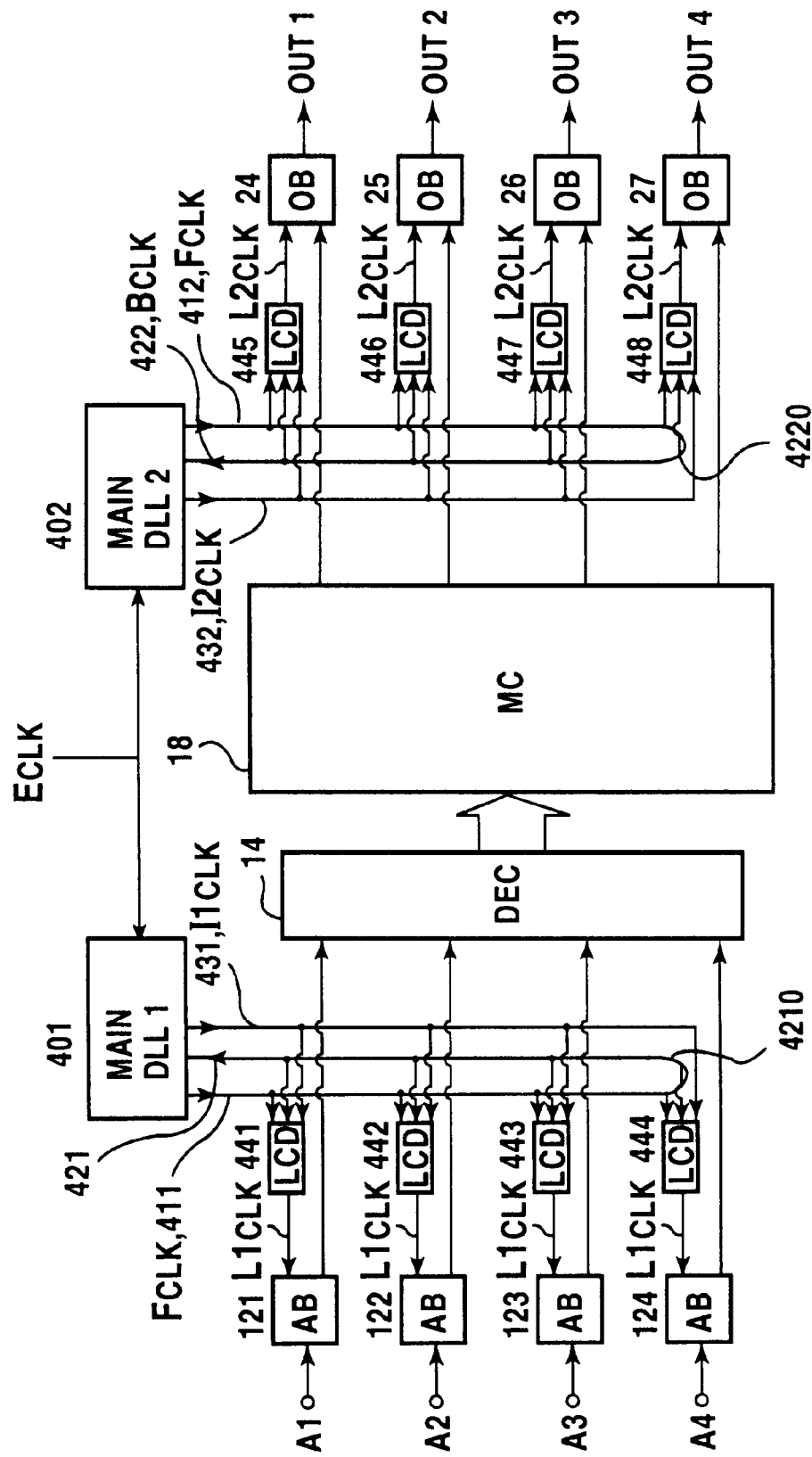
FIG. 10 is a diagram showing an example of a synchronous DRAM utilising a clock supplying circuit.

FIG. 10 is a diagram showing an example of a synchronous DRAM utilising the clock supplying circuit described above. In this example, local clock $L2_{CLK}$ is supplied to a plurality of output buffers 24–29 and local clock $L1_{CLK}$ is further supplied to a plurality of address buffers 121–124.

There are therefore provided an address buffer clock supplying circuit and an output buffer clock supplying circuit. For the address buffers, main DLL circuit 401 and forward wiring 411, backward wiring 421 and internal clock wiring 431 are arranged along address buffers 121–124, while local clock drive circuits 441–444 are arranged in the vicinity of the respective address buffers 121–124. The respective local clock drive circuits 441–444 are supplied with forward clock $F_{CLK}$, back clock $B_{CLK}$ and internal clock $I1_{CLK}$, and, as described above, a local clock $L1_{CLK}$ is generated having a phase of timing intermediate that of forward clock $F_{CLK}$ and back clock $B_{CLK}$.

Main DLL circuit 401 generates an internal clock $I1_{CLK}$ such that the address buffers can uniformly accept and latch address signals A1–A4 at the time when the clock reaches the extremity 4210. Thus, the respective local clocks $L1_{CLK}$ have phases that coincide with the timing at which the internal clock reaches extremity 4210.

For the output buffers, main DLL circuit 402 and forward wiring 412, backward wiring 422 and internal clock wiring 432 are arranged along output buffers 24–27, and local clock drive circuits 445–448 are arranged in the vicinity of the respective output buffers 24–27. The respective local clock drive circuits 445–448 are supplied with forward clock $F_{CLK}$ F back clock $B_{CLK}$ and internal clock $I2_{CLK}$ and, as described above, local clock $L2_{CLK}$ is generated with a timing intermediate that of forward clock $F_{CLK}$ and back clock $B_{CLK}$.

A clock supplying circuit according to the present invention can be widely applied to various types of circuit apart from the above in which synchronisation is to be obtained at a plurality of positions.

As described above, with the first and second embodiments, when synchronisation is sought to be obtained at any desired location in an integrated circuit, forward and backward wiring is provided from the main clock drive circuit along the circuits to be controlled and local clock drive circuits are provided in the vicinity of these controlled circuits; a local clock having a phase intermediate that of the forward clock and back clock is then generated and supplied to the controlled circuits, so all the respective controlled circuits can be operated with the same timing, and the problem of skewing of the control clock can be avoided.

Furthermore, when the main clock drive circuit generates the high-speed internal clock and the low-speed and long-period forward clock $F_{CLK}$, and the internal clock is output aligned in phase with a phase intermediate that of the forward clock and the back clock by the local clock drive circuits, the phase difference of the forward clock and back clock can be more easily detected. In this case, the phase difference can-be easily detected if, preferably, the forward clock and back clock have a period equal to or longer than the back-and-forth delay time of the wiring, so that the phase difference of the two clocks is always less than 1 period.

The clock supplying circuit of the present invention is not restricted to synchronous DRAMS, but can be widely applied to integrated circuit devices.

Third Embodiment

In the embodiments described above, a forward clock and back clock were applied to local DLLS arranged respectively in the vicinity of controlled circuits arranged in one direction with respect to a main DLL corresponding to the main clock drive circuit, and the local DLLs generated local clocks $L_{CLK}$ synchronised with the timing at the furthest extremity of the forward and backward clock wiring.

However, when the main DLL and a plurality of local DLLs are arranged in an actual integrated circuit, it is not necessarily essential that the main DLL should be arranged at one end while the plurality of local DLLs are arranged on one side of it. Instead, space for providing a main DLL may be reserved at any desired position of the plurality of local DLLS. Since the local DLLs are arranged in the vicinity of controlled circuits such as output circuits and/or input circuits, they are disposed in positions dependent on the layout of the output electrodes and/or input electrodes of the integrated circuit device. The space for arranging the main DLL will therefore be different, case-by-case. The present embodiment enables local DLLs arranged on both sides of the main DLL to generate local clocks of identical phase irrespective of the location in which the main DLL and controlled circuit are arranged.

Figure 14:
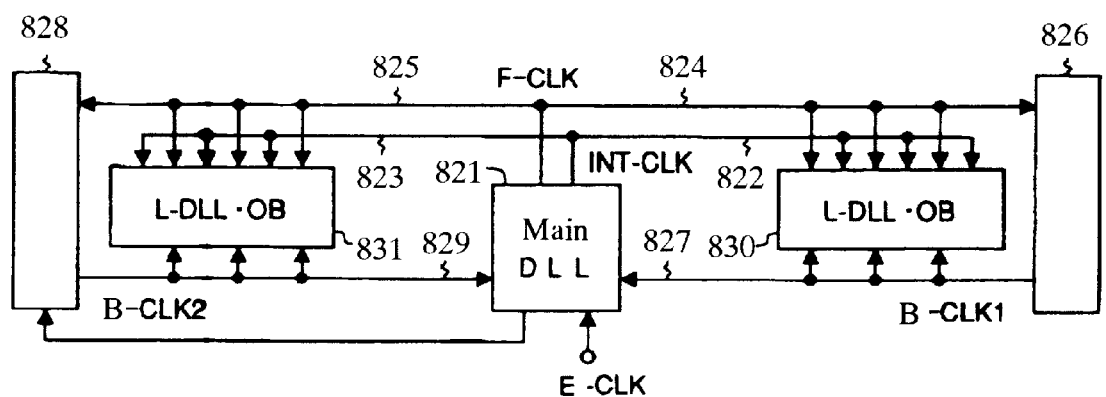
FIG. 14 is an overall layout diagram of a third embodiment.

FIG. 14 is an overall layout diagram of a third embodiment. In this example, a main DLL 821 is arranged at an arbitrary position of a plurality of output buffers OB, and on both sides of it, there are arranged a plurality of output buffers and local DLL groups 830, 831 corresponding thereto. From main DLL 821, a forward clock F-CLK is supplied to left and right forward clock wirings 824, 825, and back clocks B-CLK1, B-CLK2 are returned from both extremities through left and right backward clock wirings 827, 829. It will provisionally be assumed that forward clock wiring 824 and backward clock wiring 827 on the right side of main DLL 821 are fairly long in comparison with the corresponding wirings 825, 829 on the left-hand side, or are in circumstances of large load capacity etc. In these circumstances, the time required for clock F-CLK to travel back-and-forth along the right side wirings 824, 827 of main DLL 821 is longer than the time required for it to travel back-and-forth along the left-side wirings 825, 829. As a result, when, as described above, the local DLLs generate local clocks in synchronisation with the timing at the far extremity of the back-and-forth wiring, there will be a discrepancy between the timings of the local clocks on the two sides of the main DLL.

Accordingly, in this embodiment, a fixed delay circuit 826 is provided on for example the right-hand side back-and-forth wiring 824, 827 so as to continually generate a fixed delay time. In contrast, a variable-delay circuit 828 is provided on the left-hand side back-and-forth wiring 825, 829 so that the timing with which the left-hand back clock B-CLK2 is returned can be made to coincide with the timing with which the right-hand back clock B-CLK1 is returned. For this purpose, main DLL 821 includes a phase comparison circuit that compares the phases of the two back clocks B-CLK1 and B-CLK2. Based on the result of the phase comparison by this phase comparison circuit, the delay time of the variable-delay circuit 828 is controlled such that the phases of the two back clocks B-CLK1, B-CLK2 coincide.

Figure 15:
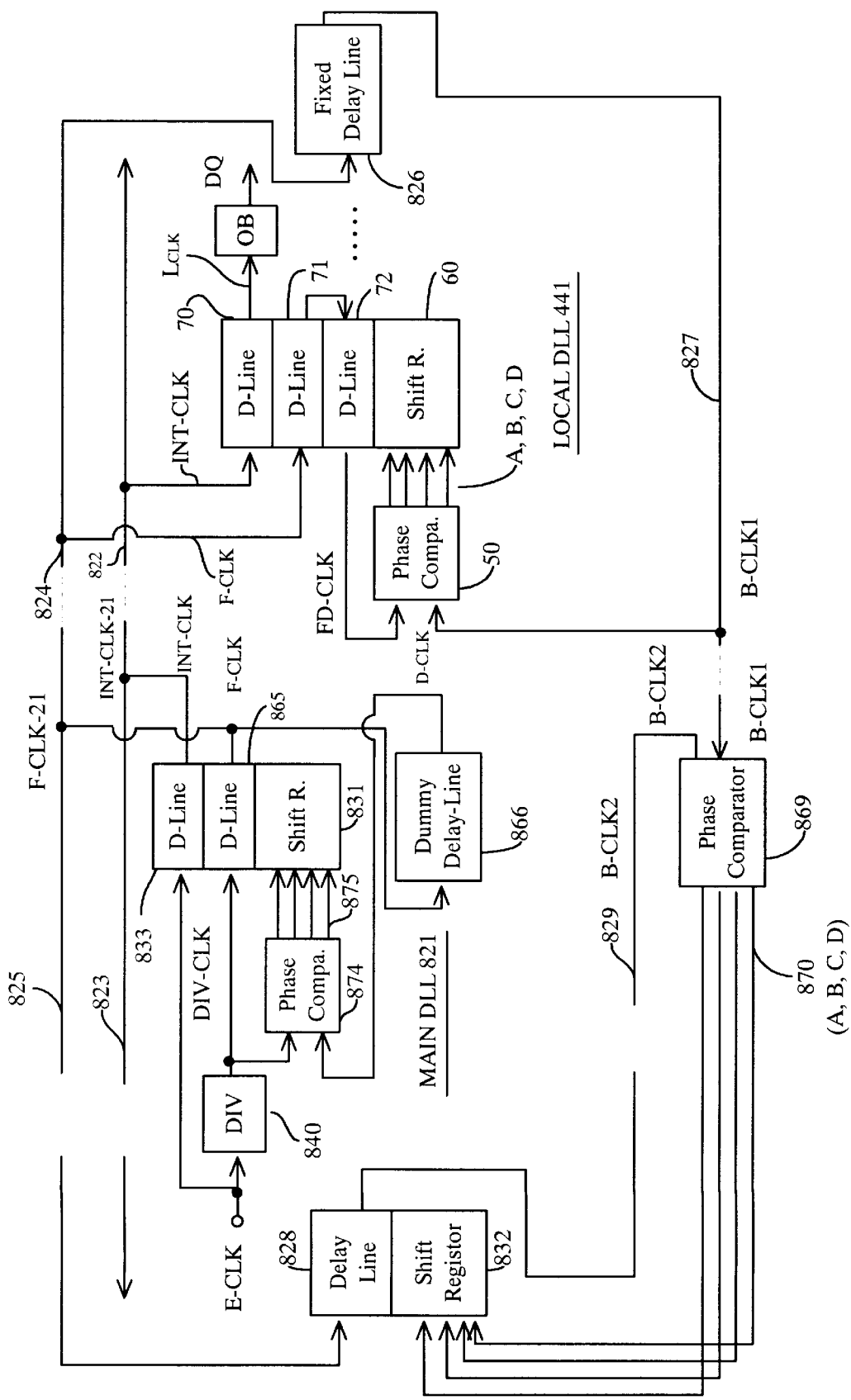
FIG. 15 is a detail circuit diagram of FIG. 14.

FIG. 15 is a detail circuit diagram of FIG. 14. In FIG. 15, to save space in the drawing, only one set of local DLLS 441 and output buffers OB corresponding thereto on the right-hand side of main DLL 821 are shown. Local DLLs 441 have the same construction as in FIG. 5. Furthermore, just as in FIG. 14, a fixed delay circuit 826 is arranged at the furthest extremity of forward clock wiring 824 while a variable-delay circuit 828 is arranged at the furthest extremity of the other backward clock wiring 829. Main DLL 821 is also provided with a phase comparison circuit 869 that detects the phase difference of the two back clocks B-CLK1, B-CLK2. There is further provided for variable delay circuit 828 a shift register 832 that is controlled by the output 870 of phase comparison circuit 869. This shift register 832 has a delay control function that controls the variable delay circuit 828: it controls the delay time of variable delay circuit 828 in accordance with the output 870 of phase comparison circuit 869 such that the phases of the two back clocks B-CLK1 and B-CLK2 coincide.

Phase comparison circuit 869, shift register 823 and variable delay circuit 828 have a similar circuit construction to phase comparison circuit 50, shift register 60 and variable delay circuit 70 described in the first and second embodiments. Their operation is also similar. In more detail, right-hand side back clock B-CLK1 passed through the fixed delay circuit 826 is supplied at the reference clock terminal Ref-CLK of the phase comparison circuit 50 shown in FIG. 8, while left-hand side back clock B-CLK2 passed through variable-delay circuit 828 whose delay is controlled is supplied to input terminal in of the phase comparison circuit 50. Comparison result signals A, B, C, D obtained by detecting the phase relationship of the two back clocks are generated as output 870. These phase comparison result signals A, B are generated when back clock B-CLK2 is delayed; shift register 832 supplies a delay control signal in response to the signals A, B such as to shorten the delay time of variable-delay circuit 828. Also, phase comparison result signals C, D are generated when back clock B-CLK2 is leading; shift register 832 supplies a delay control signal in response to these signals C, D such as to extend the delay time of variable delay circuit 828. These operations are the same as those shown in FIG. 6–FIG. 9.

By controlling the delay time of variable delay circuit 828 as described above such that the phases of the two back clocks B-CLK1 and 2 coincide, the phases of the local clocks $L_{CLK}$ generated by the local DLLs arranged on both sides of main DLL 821 can all be made to coincide independent of the position of main DLL 821 or the load capacity etc. of the clock wiring.

Figure 16:
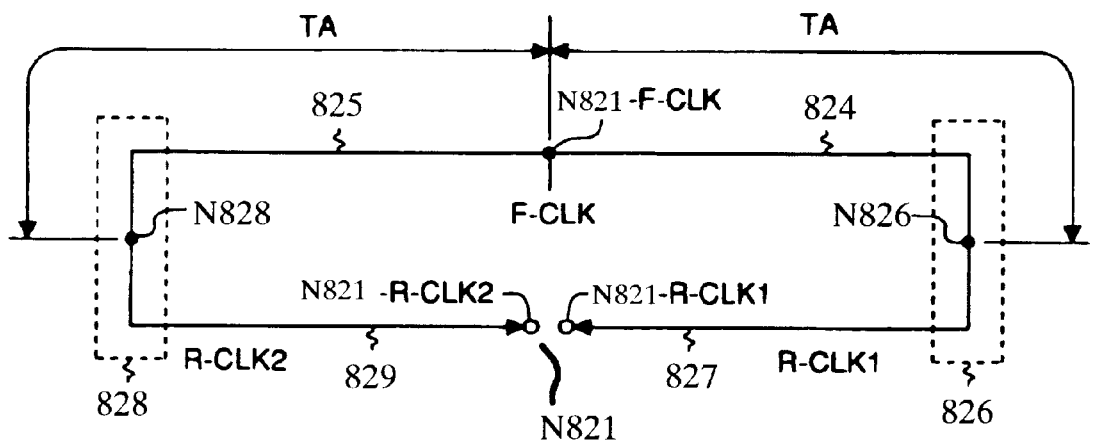
FIG. 16 is a diagram given in explanation of the operation of phase comparison circuit 869 and variable-delay circuit 828 of FIG. 15.
Figure 17:
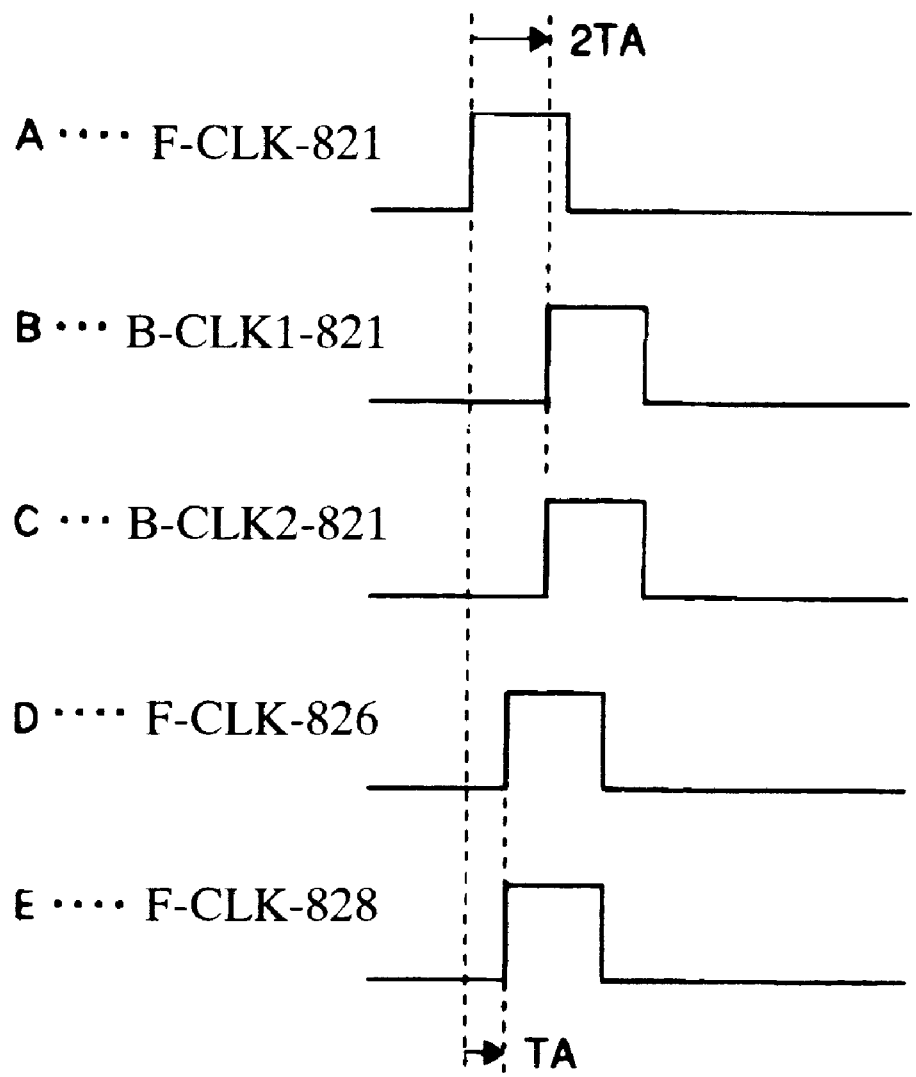
FIG. 17 is a timing chart given in explanation of the operation of phase comparison circuit 869 and variable-delay circuit 828 of FIG. 15.

FIG. 16 is a view given in explanation of the operation of phase comparison circuit 869 and variable delay circuit 828 of FIG. 15. FIG. 17 is a timing chart of this. As described above, the phases of back clocks B-CLK1, B-CLK2 coincide at the position N821 of main DLL 821. These clock periods are longer, with the provision of a margin, than the time required for their travel the forward and backward wirings, with frequency division. The times required for the two clocks B-CLK1, B-CLK2 to travel the forward and backward wiring are therefore controlled to be the same.

As shown in FIG. 16, the local clocks generated by the local DLLs located to the right of the main DLL are controlled to the timing with which the forward clock F-CLK passes through the furthest extremity N826 on the right-hand side of the forward and backward wirings 824, 827. Node N826 is an intermediate point of fixed delay circuit 826. Also, the local clocks generated by the local DLLs arranged on the left-hand side of the main DLL are controlled to the timing with which the forward clock F-CLK passes through the position of the furthest extremity N828 of the forward and backward wirings 825, 829 on the left-hand side. Node N828 is an intermediate point of variable delay circuit 828. Thus, by exercising control such that the times required for both clocks to travel the forward and backward wirings coincide, the timings with which the clocks pass through node N826 and node N828 can be made to coincide on both left and right.

If, as shown in FIG. 17, the time required for back clocks B-CLK1, B-CLK2 to travel forward and backward wirings is assumed to be 2TA, the timing which the clocks pass through nodes N826, N828 lags the forward clock F-CLK-821 generated by main DLL 821 by a time TA.

FIG. 15 shows the detailed construction of main DLL 821. Main DLL 821 generates forward clock F-CLK and an internal clock INT-CLK that is synchronised with a reference clock such as external clock E-CLK or a clock lagging the external clock by a prescribed phase (for example 120° etc.) (hereinbelow referred to simply as external clock E-CLK). Further, the two clocks INT-CLK, F-CLK are generated so as to have a phase leading by an amount corresponding to the time TA required for one-way travel of the forward and backward wiring from the external clock E-CLK, which is the reference clock.

As shown in FIG. 15, main DLL 821 comprises: frequency divider 840 that effects frequency division of the external clock (reference clock); phase comparison circuit 874 that compares the phases of the output DIV-CLK of the frequency divider and a delayed clock D-CLK obtained by delaying forward clock F-CLK by an amount corresponding to the time TA required for one-way travel along the forward and backward wiring; a shift register 831 that is supplied with the phase comparison result signal 875 generated by phase comparison circuit 874; and variable delay circuits 833, 865. Internal clock INT-CLK is output by applying external clock E-CLK to variable-delay circuit 833. Also, forward clock F-CLK is output by applying the clock DIV-CLK obtained by frequency division performed by frequency divider 840 to variable-delay circuit 865. Dummy delay circuit 866 generates the delay time TA required for one-way travel of the forward and backward wiring.

Phase comparison circuit 874, shift register 831, and variable delay circuits 833, 865 of main DLL 821 have the same circuit construction as phase comparison circuit 50, shift register 60 and variable delay circuit 70 of local DLL 441 as explained in FIG. 6, 7 and 8. Phase comparison circuit 874 is implemented by applying clock DIV-CLK obtained by frequency division by frequency divider 840 to reference clock terminal RefCLK of the circuit shown in FIG. 8 and applying delayed clock D-CLK obtained from forward clock F-CLK by delaying this by a time TA in dummy delay circuit 866 to terminal in of the circuit shown in FIG. 8.

Shift register 831, which is supplied with phase comparison result signal 875 (A, B, C, or D described above) has a delay control function whereby it controls the phases of the two input clocks DIV-CLK, D-CLK of phase comparison circuit 874 such that they coincide. As a result, forward clock F-CLK-821 and internal clock INT-CLK-821 at the output of main DLL 821 have a phase that leads external clock E-CLK by an amount corresponding to the time TA required for one-way travel of the forward and backward wirings.

Figure 18:
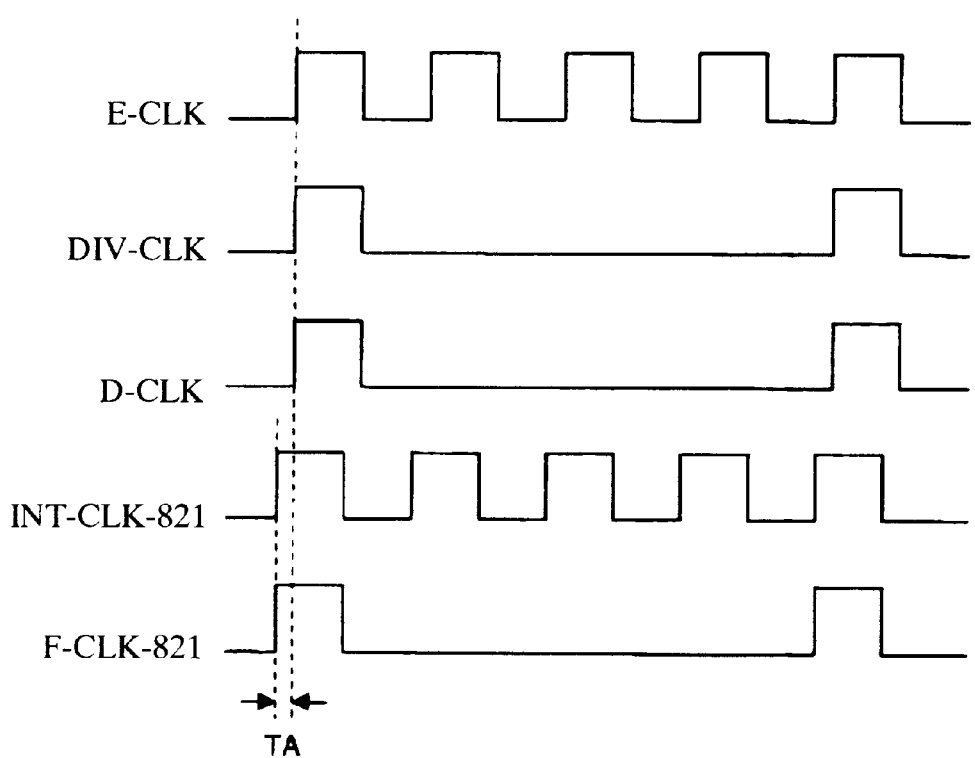
FIG. 18 is a timing chart of the operation of a main DLL.

FIG. 18 is a timing chart of the operation of the main DLL 821 as described above. External clock E-CLK is divided in frequency by a factor of 4 by frequency divider 840 to generate a divided-frequency clock DIV-CLK. The phase of delayed clock D-CLK is then controlled such that it is the same as the phase of frequency-divided clock DIV-CLK. Then, since the delayed clock D-CLK, due to dummy delay circuit 866, lags forward clock F-CLK-821 by time TA, forward clock D-CLK-821 has a phase that leads external clock E-CLK by a time TA. Likewise, internal clock INT-CLK, which is the output of variable delay circuit 833 and whose delay has been controlled by the same shift register 831, has a phase which leads external clock E-CLK by a time TA.

Consequently, local clock L-CLK that is controlled to the phase of the timing with which the clock passes through the furthest extremity of the forward and backward wirings, coincides with the phase of external clock E-CLK. If external clock E-CLK has a prescribed phase difference from the external clock supplied from outside the integrated circuit, the phase of local clock $L_{CLK}$ is controlled to the timing of this phase difference.

Figure 19:
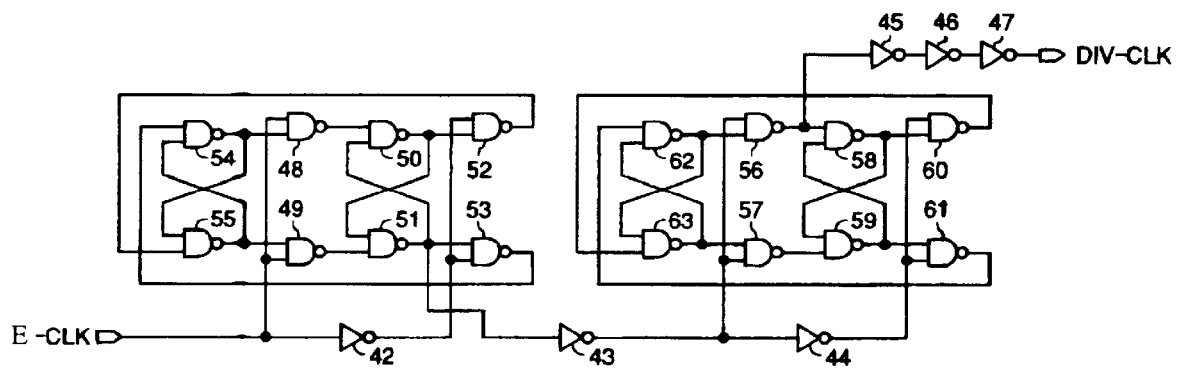
FIG. 19 is a diagram illustrating an example circuit diagram of a frequency divider 840.

FIG. 19 is a view showing an example of a circuit diagram of frequency divider 840. This example is provided with a JK flip-flop comprising NANDs 48–55 and a JK flip-flop comprising NANDs 56–63. External clock E-CLK is therefore divided in frequency by a factor of 4.

Figure 20:
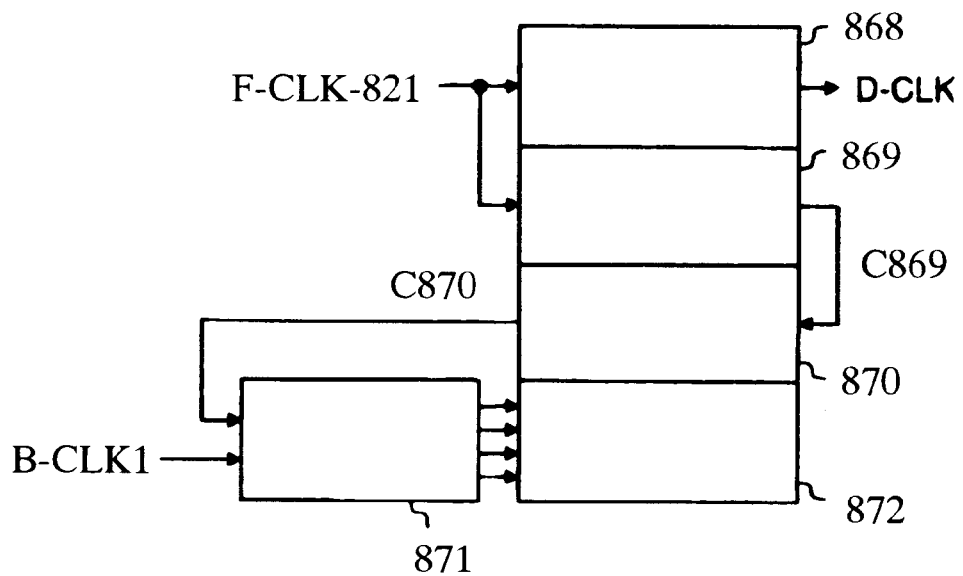
FIG. 20 is a specific circuit diagram of a dummy delay circuit 866.

FIG. 20 is a detailed circuit diagram of dummy delay circuit 866. Dummy delay circuit 866 shown in FIG. 20 generates with greater precision the time TA required for one-way propagation along the forward and backward wirings. Phase comparison circuit 871 inputs, as reference clock, the back clock B-CLK1 that returns along the right-hand forward and backward wirings 824, 827 of FIG. 15 and furthermore inputs clock C870 generated by forward clock F-CLK passing through the two variable-delay circuits 869, 879. Shift register 872 controls the delay times of variable-delay circuits 868, 869, 870 such that the phase of clock C870 coincides with the phase of back clock B-CLK1 which has a fixed delay characteristic. This dummy delay circuit 866 also has a kind of DLL circuit construction: phase comparison circuit 871, shift register 872 and variable-delay circuits 868–870 have the same circuit construction as the corresponding circuits of local DLL 441. However, phase comparison circuit 871 in dummy delay circuit 866 has a slightly different construction from that of phase comparison circuit 874 in main DLL 821.

Phase comparison circuit 874 in main DLL 821 has a construction equivalent to the phase comparison circuit shown in FIG. 8. In the phase comparison circuit shown in FIG. 8, according to the delay element 500, the phases are deemed to be coincided when input clock in has a timing earlier than the reference clock within the delay time of delay element 500. Contrariwise, in the case of phase comparison circuit 871 in dummy delay circuit 866, it is therefore desirable that the phases should be deemed to be coincided when input clock in has a timing later than the reference clock within the delay time of delay element 500. In order to achieve such a construction, it is necessary to arrange the delay element 500 of FIG. 8 on the side of the terminal of reference clock RefCLK in phase comparison circuit 871 of dummy delay circuit 866. By arranging for the offsets of the two phase comparison circuit 871 and 874 to be in opposite directions, these offsets are made to cancel out.

Figure 21:
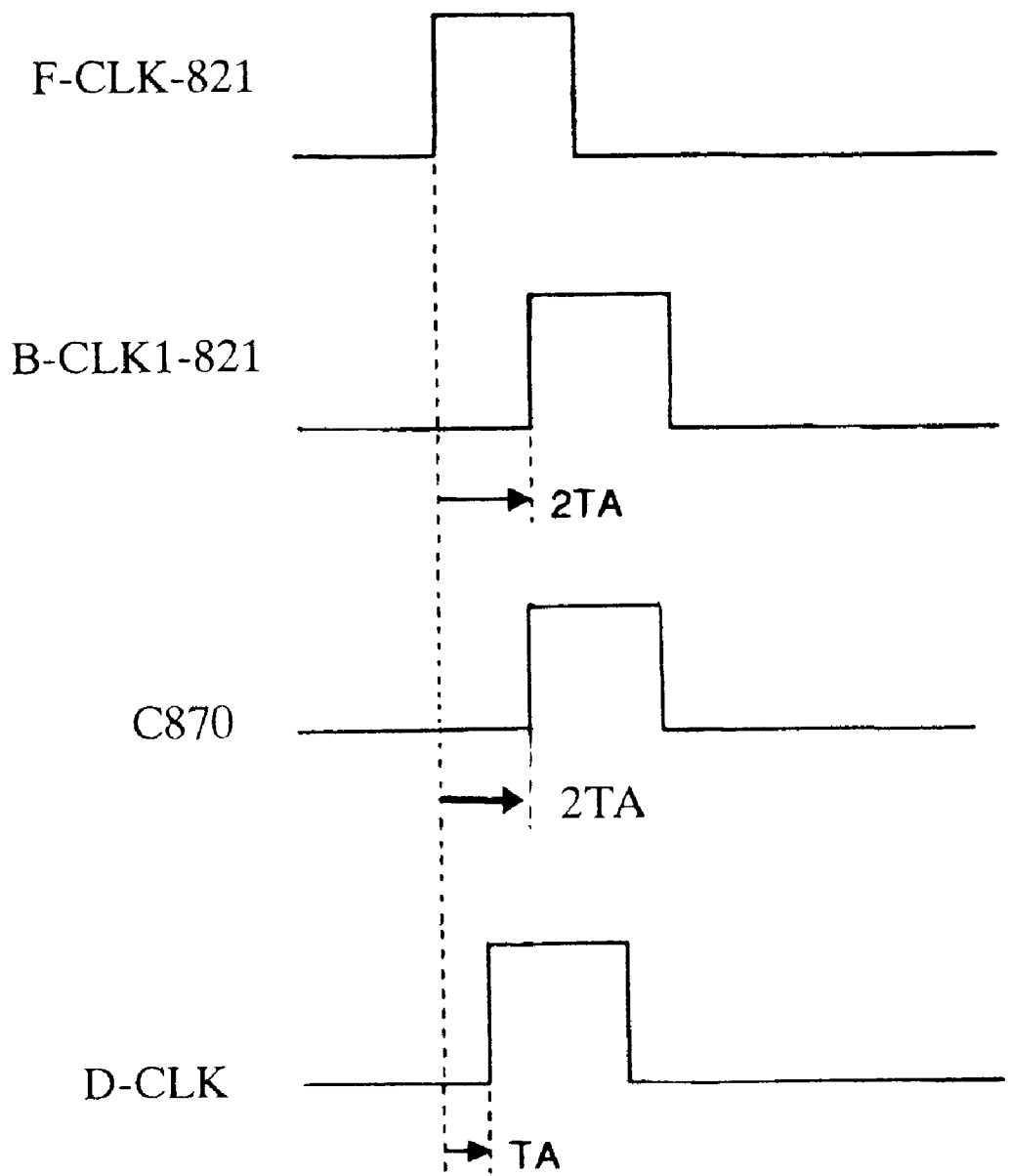
FIG. 21 is a timing chart of a dummy delay circuit 866.

FIG. 21 is a timing chart of dummy delay circuit 866. The phase of clock C870 coincides with that of back clock B-CLK1-821, which is the reference clock. Since back clock B-CLK1-821 is delayed from forward clock F-CLK1-821 by the amount of the propagation time 2TA needed for travelling the forward and backward wirings, the delayed clock D-CLK generated by variable-delay circuit 868 is only delayed by half of clock C870 and so has a phase that is delayed from that of forward clock F-CLK-821 by propagation time TA, exactly half of the forward and backward wiring.

Returning to main DLL 821, by controlling delayed clock D-CLK which has a phase lagging forward clock F-CLK by a time TA, such that it coincides with the phase of frequency-divided clock DIV-CLK, the forward clock F-CLK is controlled to have a phase that leads frequency-divided clock DIV-CLK by the amount of the time TA.

Fourth Embodiment

Figure 22:
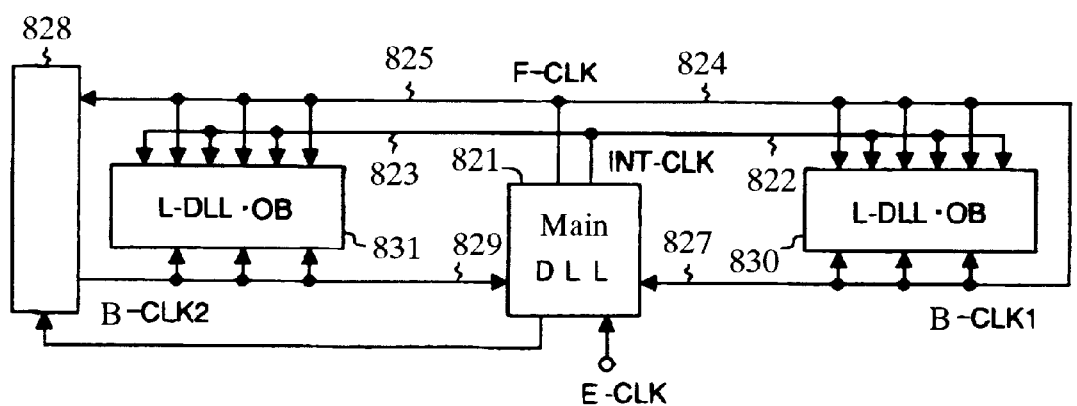
FIG. 22 is a diagram showing a fourth embodiment.

FIG. 22 is a diagram showing a fourth embodiment. In FIG. 22, parts same as in FIG. 14 are given the same reference symbols. As is clear by comparison with FIG. 14, in this example the fixed delay circuit 826 which is provided in the forward and backward wiring of the right-hand-side of main DLL 821 is eliminated. FIG. 22 is an example of application to the case where the forward and backward wirings 824, 822, 827 on the right-hand side of main DLL 821 are considerably longer than on the left-hand side. Since the forward and backward wirings on the right-hand side already has a considerable delay time characteristic, a fixed-delay circuit is unnecessary. The delay times of the forward and backward wirings on both sides are therefore controlled to be the same by means of the variable-delay circuit 828 which is provided in the forward and backward wirings on the left-hand side of main DLL 821.

Fifth Embodiment

Figure 23:
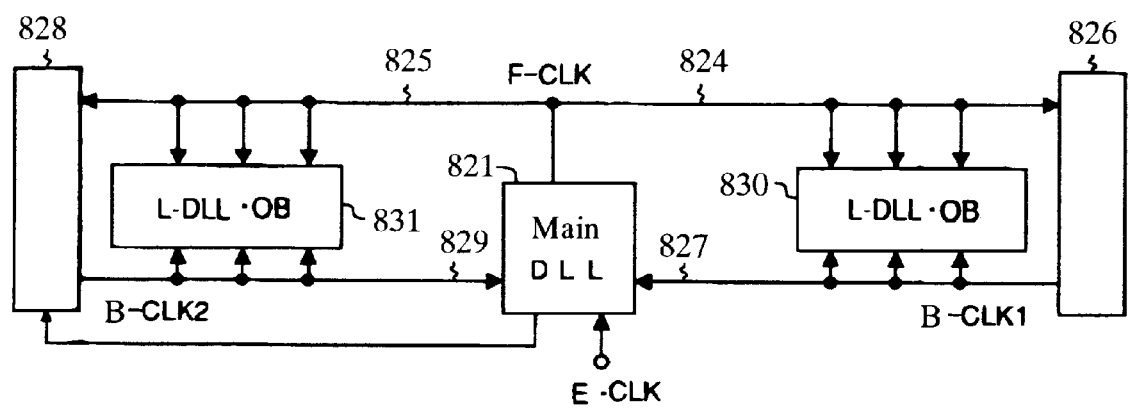
FIG. 23 is a diagram showing a fifth embodiment.

FIG. 23 shows a fifth embodiment. In FIG. 23, parts same as in FIG. 14 are given the same reference symbols. As is clear by comparison with FIG. 14, in this example the internal clock wiring is eliminated and the delayed forward clock F-CLK also serves the function of the internal clock of FIG. 14 without being subjected to frequency division in the local DLL group. That is, this is the same as the example shown in FIG. 1. A fixed-delay circuit 826 and variable-delay circuit 828 are therefore provided in the left and right forward and backward wirings as in FIG. 14, and the phases of the left-hand and right-hand back clocks are controlled to be the same.

Sixth Embodiment

Figure 24:
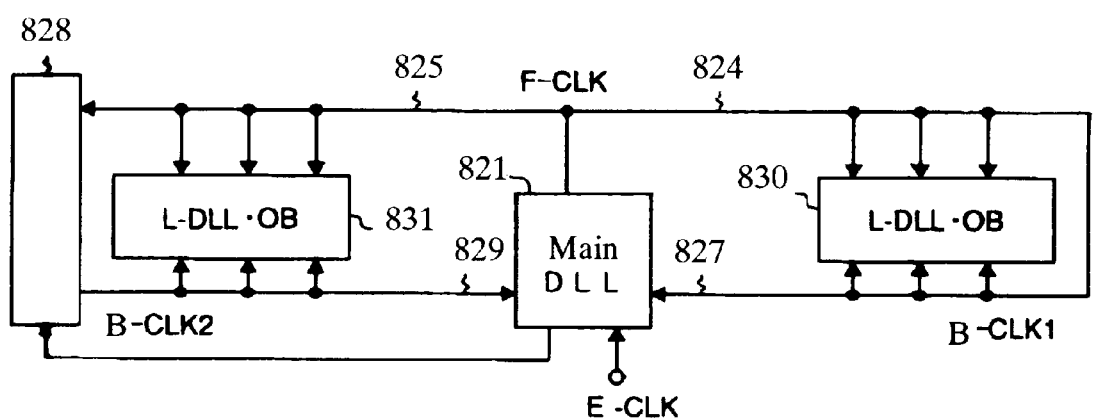
FIG. 24 is a diagram showing a sixth embodiment.

FIG. 24 shows a sixth embodiment. In FIG. 24, parts same as in FIG. 23 are given the same reference symbols. As is clear by comparison with FIG. 23, in this example the fixed-delay circuit is eliminated from the right-hand forward and backward wirings. In other respects, this example is the same as FIG. 24.

As described above, in the third to sixth embodiments, a plurality of local DLLs which are arranged on both sides of the main DLL can generate local clocks having the same phase, irrespective of the location in which the main DLL is provided and irrespective of the delay characteristics of the left-hand side and right-hand side forward and backward wirings.

What is claimed is:

1. A clock supplying circuit that supplies a clock to a plurality of controlled circuits arranged in respectively different positions, comprising:

a forward and backward wiring arranged along the plurality of controlled circuits;

a main clock drive circuit for outputting a first clock to the forward wiring of the forward and backward wiring; and a plurality of local clock drive circuits, arranged in the respective vicinities of the controlled circuits and being supplied with a forward clock propagated by the first clock along the forward wiring of the forward and backward wiring and with a back clock propagated along the backward wiring of the forward and backward wiring, for generating local clocks having phase intermediate the forward clock and the back clock and supplying the local clocks to the respective corresponding controlled circuits, wherein the main clock drive circuit is supplied with a reference clock and controls the phase of the first clock such that the phase at the time when the first clock reaches the extremity of the forward wiring coincides with the phase of the reference clock.

2. The clock supplying circuit according to claim 1, wherein each of the local clock drive circuits comprises a delay circuit that delays the forward clock; and a phase comparison circuit that compares the phases of a first delayed clock delayed by the delay circuit and the back clock; the amount of delay of the delay circuit being controlled in response to the output of the phase comparison circuit such that the phases of the first delayed clock and the back clock coincide; and furthermore each of the local clock drive circuits outputting as local clock a second delayed clock obtained by delaying the forward clock by a time of half the amount of delay of the delay circuit.

3. The clock supplying circuit according to claim 1, wherein the main clock drive circuit comprises a first variable-delay circuit generating the first clock by delaying the reference clock, a dummy delay circuit having a delay characteristic of one-way propagation along the forward and backward wiring, and a phase comparison circuit comparing the phase of the reference clock and a delayed clock obtained by passing the first clock through the dummy delay circuit, the delay characteristic of the first variable-delay circuit being controlled such that the phases of the reference clock and the delayed clock coincide.

4. A clock supplying circuit that supplies a clock to a plurality of controlled circuits arranged in respectively different positions, comprising:
  a forward and backward wiring arranged along the plurality of controlled circuits;
  an internal clock supply wiring arranged along the plurality of controlled circuits;
  a main clock drive circuit for outputting a first clock to the forward wiring of the forward and backward wiring and for outputting a second clock whose cycle is shorter than the first clock to the internal clock supply wiring; and
  a plurality of local clock drive circuits, arranged in the respective vicinities of the controlled circuits, being supplied with a forward clock propagated by the first clock along the forward wiring and with a back clock propagated along the backward wiring, and being also supplied with the second clock propagating along the internal clock supply wiring, for delaying the phase of the second clock with a half phase difference between the forward clock and the back clock, and for supplying the delayed clock of the second clock to the respectively corresponding controlled circuits as local clock.

5. The clock supplying circuit according to claim 4, wherein the main clock drive circuit is supplied with a reference clock and generates the first clock with a phase controlled such that the phase at the time at which the first clock arrives at the extremity of the forward wiring coincides with the phase of the reference clock.

6. The clock supplying circuit according to claim 4, wherein the main clock drive circuit is supplied with a reference clock, generates the second clock having a prescribed phase difference with the reference clock, and furthermore generates the first clock.

7. The clock supplying circuit according to claim 4, wherein the main clock drive circuit is supplied with a reference clock, generates the second clock having a prescribed phase difference with the reference clock, and furthermore generates the first clock by frequency division of the reference clock.

8. The clock supplying circuit according to claim 4, wherein each of the local clock drive circuits comprises a first delay circuit delaying the forward clock; a second delay circuit delaying the second clock with a time of half the delay amount of the first delay circuit; and a phase comparison circuit comparing the phase of the first delayed clock delayed by the first delay circuit with the phase of the back clock; the amount of delay of the first and second delay circuits being controlled in response to the output of the phase comparison circuit such that the phases of the first delayed clock and the back clock coincide, and furthermore each of the local clock drive circuits outputting as the local clock a second delayed clock delayed by the second delay circuit.

9. The clock supplying circuit according to claim 4, wherein each of the local clock drive circuits comprises a first delay circuit that comprises a first delay section delaying the forward clock and a second delay section delaying the forward clock that has been delayed by the first delay section by the same amount of time as the first delay section; a second delay circuit that delays the second clock by the same amount of time as the first delay section; a phase comparison circuit that compares the phase of the first delayed clock delayed by the first delay circuit with the phase of the back clock; and the delay amounts of the first delay section, the second delay section and the second delay circuit being respectively controlled in the same way in response to the output of the phase comparison circuit such that the phases of the first delayed clock and the back clock coincide; and furthermore each of the local clock drive circuits outputting as the local clock a second delayed clock delayed by the second delay circuit.

10. The clock supplying circuit according to claim 4, wherein the period of the first clock is longer than the time for propagation through the forward and backward wiring.

11. An integrated circuit device having a clock supplying circuit that supplies a clock to a plurality of controlled circuits arranged in respectively different positions wherein the clock supplying circuit comprises:
  a forward and backward wiring arranged along the plurality of controlled circuits;
  a main clock drive circuit for outputting a first clock to the forward wiring of the forward and backward wiring; and
  a plurality of local clock drive circuits arranged in the respective vicinities of the controlled circuits and being supplied with a forward clock propagated by the first clock along the forward wiring of the forward and backward wiring and with a back clock propagated along the backward wiring of the forward and backward wiring, for generating local clocks having phase intermediate the forward clock and the back clock and supplying the local clocks to the respective corresponding controlled circuits, wherein the main clock drive circuit is supplied with a reference clock and controls the phase of the first clock such that the phase at the time when the first clock reaches the extremity of the forward wiring coincides with the phase of the reference clock.

12. An integrated circuit device having a clock supplying circuit that supplies a clock to a plurality of controlled circuits arranged in respectively different positions wherein the clock supplying circuit comprises:

a forward and backward wiring arranged along the plurality of controlled circuits;

an internal clock supply wiring arranged along the plurality of controlled circuits;

a main clock drive circuit for outputting a first clock to the forward wiring of the forward and backward wiring and for outputting a second clock whose cycle is shorter than the first clock to the internal clock supply wiring; and a plurality of local clock drive circuits, arranged in the respective vicinities of the controlled circuits, being supplied with a forward clock propagated by the first clock along the forward wiring and with a back clock propagated along the backward wiring, and being also supplied with the second clock propagating along the internal clock supply wiring, for delaying the phase of the second clock with a half phase difference between the forward clock and the back clock, and for supplying the delayed clock of the second clock to the respectively corresponding controlled circuits as local clock.

13. A clock supplying circuit that supplies a clock to a plurality of controlled circuits arranged in respectively different positions, wherein the plurality of controlled circuits comprise a first group of controlled circuits and a second group of controlled circuits; comprising:

a first forward and backward wiring arranged along the first group of controlled circuits;

a second forward and backward wiring arranged along the second group of controlled circuits;

a main clock drive circuit outputting a first clock to the respective forward wirings of the first and second forward and backward wirings;

a plurality of first local clock drive circuits, arranged in the respective vicinities of the first group of controlled circuits and being supplied with a first forward clock propagated by the first clock along the first forward wiring and with a first back clock propagated along the first backward wiring, for generating local clocks having phase intermediate the first forward clock, and the first back clock, and supplying the local clocks to the respective corresponding controlled circuits;

a plurality of second local clock drive circuits, arranged in the respective vicinities of the second group of controlled circuits and being supplied with a second forward clock propagated by the first clock along the second forward wiring and with a second back clock propagated along the second backward wiring, for generating local clocks having phase intermediate the second forward clock and the second back clock, and supplying the local clocks to the respective corresponding controlled circuits; and a forward and backward wiring delay circuit provided on the second forward and backward wiring and having a delay characteristic such that the phases of the back clocks propagated along the first and second backward wirings coincide.

14. The clock supplying circuit according to claim 13, further comprising a phase comparison circuit that compares the phases of the back clocks propagated along the first and second backward wirings; wherein the forward and backward wiring delay circuit is controlled in response to the output of the phase comparison circuit such that the amount of delay of the forward and backward wiring delay circuit makes the phases of the two back clocks coincide.

15. A clock supplying circuit that supplies a clock to a plurality of controlled circuits arranged in respectively different positions, wherein the plurality of controlled circuits comprise a first group of controlled circuits and a second group of controlled circuits; comprising:

a first forward and backward wiring arranged along the first group of controlled circuits;

a second forward and backward wiring arranged along the second group of controlled circuits;

a first internal clock supply wiring arranged along the first group of controlled circuits;

a second internal clock supply wiring arranged along the second group of controlled circuits;

a main clock drive circuit for outputting a first clock to the first and second forward wirings and for outputting a second clock whose period is shorter than the first clock to the first and second internal clock supply wirings;

a plurality of first local clock drive circuits, arranged in the respective vicinities of the first group of controlled circuits, being supplied with a first forward clock propagated by the first clock along the first forward wiring and with a first back clock propagated along the first backward wiring, and being further supplied with the second clock propagating along the first internal clock supply wiring, for delaying the phase of the second clock so as to coincide with a phase intermediate the first forward clock and the first back clock, and for supplying the delayed clock of the second clock to each of the respective corresponding controlled circuits as local clock;

a plurality of second local clock drive circuits, arranged in the respective vicinities of the second group of controlled circuits, being supplied with a second forward clock propagated by the first clock along the second forward wiring and with a second back clock propagated along the second backward wiring, and being further supplied with the second clock propagating along the second internal clock supply wiring, for delaying the phase of the second clock so as to coincide with a phase intermediate the second forward clock and second back clock, and for supplying the delayed clock of the second clock to each of the respective corresponding controlled circuits as local clock; and a forward and backward wiring delay circuit provided on the second forward and backward wiring and having a delay characteristic such that the phases of the back clocks propagated along the first and second backward wirings coincide.

16. The clock supplying circuit according to claim 15, further comprising a phase comparison circuit that compares the phases of the back clocks propagated along the first and second backward wirings; wherein the forward and backward wiring delay circuit is controlled in response to the output of the phase comparison circuit such that the amount of delay of the forward and backward wiring delay circuit makes the phases of the two back clocks coincide.

* * * * *